(12) United States Patent
Miyatake et al.

(10) Patent No.: US 8,459,116 B2
(45) Date of Patent: Jun. 11, 2013

(54) PHYSICAL QUANTITY SENSOR

(75) Inventors: Akira Miyatake, Niigata-ken (JP); Toru Takahashi, Niigata-ken (JP); Hisanobu Ohkawa, Niigata-ken (JP); Katsuya Kikuiri, Niigata-ken (JP); Hisayuki Yazawa, Niigata-ken (JP); Toshihiro Kobayashi, Niigata-ken (JP); Yoshitaka Uto, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 77 days.

(21) Appl. No.: 13/296,991

(22) Filed: Nov. 15, 2011

(65) Prior Publication Data

US 2012/0055249 A1 Mar. 8, 2012

Related U.S. Application Data

(63) Continuation of application No. PCT/JP2010/058336, filed on May 18, 2010.

(30) Foreign Application Priority Data

Jun. 3, 2009 (JP) ................................. 2009-133981
Aug. 31, 2009 (JP) ................................. 2009-199146

(51) Int. Cl.
*G01P 15/125* (2006.01)
(52) U.S. Cl.
USPC ........................................ 73/514.32; 73/510
(58) Field of Classification Search
USPC ............... 73/514.32, 514.01, 514.16, 514.21, 73/514.29
See application file for complete search history.

(56) References Cited

U.S. PATENT DOCUMENTS

| | | | | |
|---|---|---|---|---|
| 5,763,783 | A | * | 6/1998 | Asada .......................... 73/514.31 |
| 6,089,092 | A | * | 7/2000 | Shinohara et al. .......... 73/514.01 |
| 6,131,457 | A | * | 10/2000 | Sato ............................ 73/514.31 |
| 6,668,614 | B2 | * | 12/2003 | Itakura ............................ 73/1.38 |

(Continued)

FOREIGN PATENT DOCUMENTS

| | | |
|---|---|---|
| EP | 2 315 039 | 4/2011 |
| JP | 64-17430 U | 1/1989 |

(Continued)

OTHER PUBLICATIONS

International Search Report dated Jun. 22, 2010 from International Application No. PCT/JP2010/058336.

(Continued)

*Primary Examiner* — Peter Macchiarolo
*Assistant Examiner* — Samir M Shah
(74) *Attorney, Agent, or Firm* — Beyer Law Group LLP

(57) ABSTRACT

A physical quantity sensor includes an anchor portion, a movable portion displaceable in a height direction, a supporting portion rotatably connected to the anchor portion and the movable portion, and a detection portion. The supporting portion includes a first connection arm connecting the anchor portion and the movable portion to each other and a leg portion extending from the anchor portion in a direction opposite to the first connection arm, the leg portion being displaced in a direction opposite to a displacement direction of the movable portion when the supporting portion rotates. A stopper surface is disposed at a position to which a distal end portion of the leg portion is contactable when the leg portion is displaced in the direction opposite to the displacement direction of the movable portion. Displacement of the movable portion is restricted when the distal end portion of the leg portion contacts the stopper surface.

18 Claims, 12 Drawing Sheets

U.S. PATENT DOCUMENTS

| | | | |
|---|---|---|---|
| 6,763,716 B2* | 7/2004 | Nagahara et al. | 73/493 |
| 6,981,416 B2* | 1/2006 | Chen et al. | 73/510 |
| 7,019,231 B2 | 3/2006 | Ishikawa et al. | |
| 7,258,012 B2* | 8/2007 | Xie | 73/514.32 |
| 7,263,885 B2* | 9/2007 | Goto | 73/514.32 |
| 7,430,909 B2* | 10/2008 | Adams et al. | 73/510 |
| 7,464,591 B2 | 12/2008 | Fukuda et al. | |
| 7,520,171 B2* | 4/2009 | Merassi et al. | 73/514.32 |
| 7,784,344 B2* | 8/2010 | Pavelescu et al. | 73/514.32 |
| 7,934,423 B2* | 5/2011 | Nasiri et al. | 73/514.02 |
| 8,047,075 B2* | 11/2011 | Nasiri et al. | 73/514.32 |
| 8,100,010 B2* | 1/2012 | Fly et al. | 73/493 |
| 8,156,804 B2* | 4/2012 | Sakai et al. | 73/493 |
| 8,205,498 B2* | 6/2012 | Hsu et al. | 73/514.32 |
| 8,225,660 B2* | 7/2012 | Sakai et al. | 73/504.12 |
| 8,397,570 B2* | 3/2013 | Verjus et al. | 73/510 |
| 2002/0158293 A1* | 10/2002 | Lee et al. | 257/414 |
| 2003/0036214 A1* | 2/2003 | Eskridge | 438/48 |
| 2004/0025591 A1* | 2/2004 | Yoshikawa et al. | 73/514.32 |
| 2004/0079154 A1* | 4/2004 | Yoshikawa et al. | 73/514.32 |
| 2005/0092107 A1* | 5/2005 | Eskridge | 73/862.626 |
| 2006/0213268 A1* | 9/2006 | Asami et al. | 73/514.16 |
| 2007/0034007 A1* | 2/2007 | Acar | 73/514.01 |
| 2007/0220973 A1* | 9/2007 | Acar | 73/504.12 |
| 2008/0110260 A1* | 5/2008 | Konno et al. | 73/514.32 |
| 2010/0186507 A1* | 7/2010 | GUnthner et al. | 73/504.14 |

FOREIGN PATENT DOCUMENTS

| | | |
|---|---|---|
| JP | 3-16042 Y2 | 4/1991 |
| JP | 9-127151 | 5/1997 |
| JP | 2002-257847 | 9/2002 |

OTHER PUBLICATIONS

Supplementary Search Report dated Nov. 15, 2012 from European Patent Application No. 10783252.9.

* cited by examiner

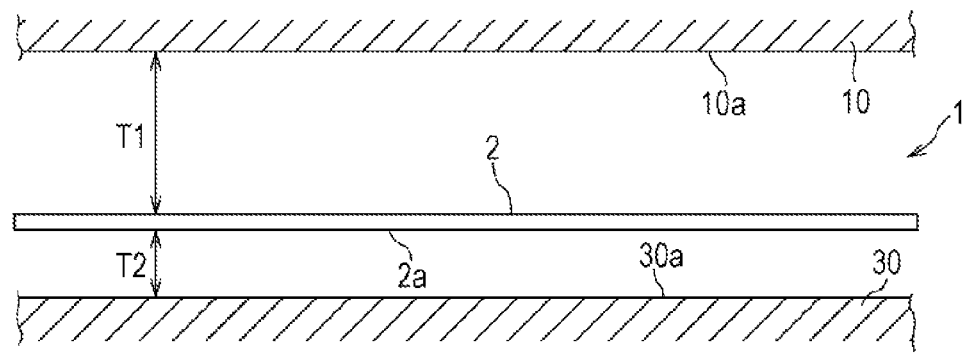
FIG. 5A
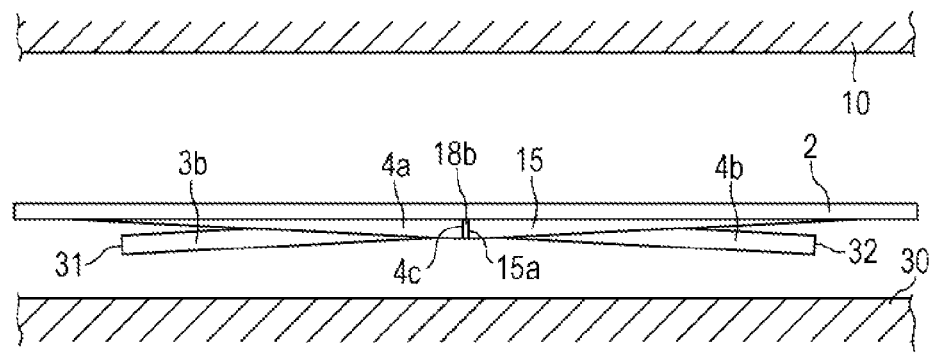
FIG. 5B
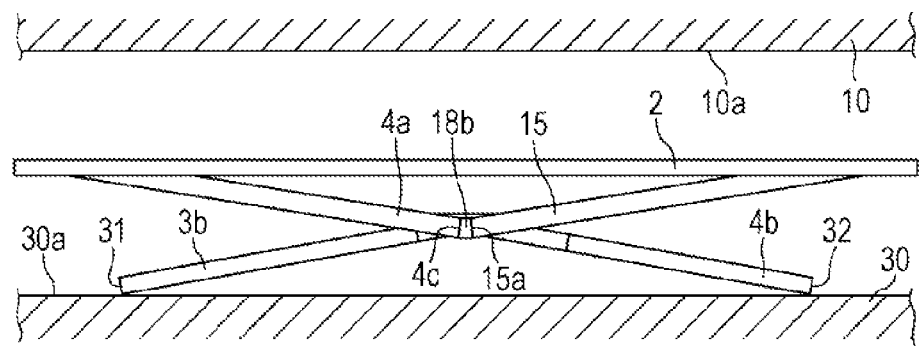
FIG. 5C
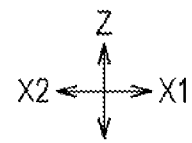

PHYSICAL QUANTITY SENSOR

CLAIM OF PRIORITY

This application is a Continuation of International Application No. PCT/JP2010/058336 filed on May 18, 2010, which claims benefit of Japanese Patent Application No. 2009-133981 filed on Jun. 3, 2009 and No. 2009-199146 filed on Aug. 31, 2009. The entire contents of each application noted above are hereby incorporated by reference.

BACKGROUND OF THE INVENTION

1. Field of the Invention

The present invention relates to a physical quantity sensor that is capable of measuring a physical quantity, such as acceleration, applied from the outside by detecting a displacement amount of a movable portion that is formed by, for example, cutting from a silicon substrate.

2. Description of the Related Art

For example, a physical quantity sensor includes a movable portion that is made by etching a silicon substrate and that is supported so as to be movable in the height direction. In such a case, for example, in a structure described in Japanese Unexamined Patent Application Publication No. 2005-283393, a movable portion that is displaceable in the height direction is swingably supported via a deformable beam portion by a frame body that surrounds the movable portion. However, if a large physical quantity acts on the movable portion or if a physical quantity acts on the movable portion for a long time, the beam portion may become overloaded, so that damage or the like may be caused to the beam portion or the beam portion may not be able to recover to its original stationary state even when the action of the physical quantity disappears. Accordingly, the sensor sensitivity tends to decrease, and the sensor's life could not be effectively prolonged. In the structure described in Japanese Unexamined Patent Application Publication No. 2005-283393, a weight stopper is provided. However, the structure described Japanese Unexamined Patent Application Publication No. 2005-283393 is a complex structure in which a step is formed on a surface of the weight in a height direction and the weight stopper faces a recessed portion of the weight in the height direction. It is very difficult to form this structure by using MEMS technology.

With the existing structure described above, movement of the movable portion is unstable and fluctuating and deformation of the beam portion in the height direction is hindered, so that it was difficult for the movable portion to perform translational motion in the height direction in a stable manner and it is not possible to obtain precise sensor sensitivity.

The sensor may stop functioning if the movable portion, which has been displaced in the height direction, surface-contacts a facing surface that faces the movable portion and the movable portion sticks to the facing surface. To prevent this, the sensor has a sticking prevention structure for preventing sticking of the movable portion. The structure includes protrusions or the like disposed on the movable portion or on a facing surface that faces the movable portion.

However, it was difficult to precisely form a sticking prevention structure composed of, for example, protrusions, on the movable portion or on the facing surface that faces the movable portion.

Even with the configurations described in Japanese Unexamined Patent Application Publication Nos. 2005-283393 and 2008-197113, the stopper and the weight tend to surface-contact each other, and sticking tends to occur. Japanese Unexamined Patent Application Publication No. 9-127151 describes a configuration including stopper protrusions, which has been generally used.

SUMMARY OF THE INVENTION

The present invention, which addresses the existing problems described above, provides a physical quantity sensor having high sensor sensitivity and good anti-sticking characteristics.

According to the present invention, a physical quantity sensor includes an anchor portion immovably supported, a movable portion displaceable in a height direction, a supporting portion rotatably connected to the anchor portion and to the movable portion, and a detection portion for detecting displacement of the movable portion. The supporting portion includes a leg portion for restricting the displacement of the movable portion by moving in a direction opposite to a displacement direction of the movable portion when the supporting portion rotates and the movable portion is displaced in the height direction. The supporting portion includes a first connection arm connecting the anchor portion and the movable portion to each other, the leg portion extends from the anchor portion in a direction opposite to the first connection arm, and when the supporting portion rotates, the first connection arm and the leg portion are displaced in opposite directions around a fulcrum joint between the anchor portion and the first connection arm. A plurality of the supporting portions each including the leg portion is provided, the first connection arm of one of the supporting portions and the first connection arm of another of the supporting portions extend in opposite directions with the anchor portion therebetween, and the leg portion of the one of the supporting portions and the leg portion of the another of the supporting portions extend in opposite directions with the anchor portion therebetween.

With the present invention, a supporting structure includes the supporting portion rotatably connected to the anchor portion and to the movable portion, and the supporting portion includes the leg portion for restricting the displacement of the movable portion. Therefore, the movable portion can perform translational motion in the height direction with a simple structure; load and damage applied to and damage caused to the movable portion, a joint, and the like are reduced; and thereby the sensor sensitivity can be improved. Anti-sticking characteristics can be improved with a simple structure that does not have protrusions formed on the movable portion or on a facing surface that faces the movable portion as in existing structures. The size and thickness of the physical quantity sensor according to the present invention can be considerably reduced.

Moreover, the movable portion can be displaced in the height direction with a simple mechanism, and the leg portion can be displaced in a direction opposite to the displacement direction of the movable portion.

Furthermore, because a plurality of the supporting portion are provided, the movable portion is supported by one of the supporting portions and by another of the supporting portions at positions facing each other with the anchor portion therebetween, and the leg portions extend in opposite directions with the anchor portion therebetween. Therefore, the movable portion can perform translational motion in the height direction, and precise sensor sensitivity can be easily obtained. Because there are a plurality of leg portions that contact the stopper surface, function of stopping the movable portion can be improved.

In the present invention, it is preferable that a facing portion have a stopper surface at a position facing the leg portion, the facing portion being a portion that the leg portion approaches when the leg portion is displaced in the direction opposite to the displacement direction of the movable portion. In this case, displacement of the movable portion can be restricted with a simple structure.

According to the present invention, a physical quantity sensor includes an anchor portion immovably supported, a movable portion displaceable in a height direction, a supporting portion rotatably connected to the anchor portion and the movable portion, and a detection portion for detecting displacement of the movable portion.

The supporting portion includes a first connection arm connecting the anchor portion and the movable portion to each other and a leg portion extending from the anchor portion in a direction opposite to the first connection arm, the leg portion being displaced in a direction opposite to a displacement direction of the movable portion when the supporting portion rotates and the movable portion is displaced in the height direction.

A facing portion has a stopper surface at a position facing the leg portion, the facing portion being a portion that the leg portion approaches when the leg portion is displaced in the direction opposite to the displacement direction of the movable portion.

A plurality of the supporting portions each including the leg portion is provided, the first connection arm of one of the supporting portions and the first connection arm of another of the supporting portions extend in opposite directions with the anchor portion therebetween, and the leg portion of the one of the supporting portions and the leg portion of the another of the supporting portions extend in opposite directions with the anchor portion therebetween.

With the configuration according to the present invention, the physical quantity sensor has high sensor sensitivity and good anti-sticking characteristics with a considerably small and thin structure.

In the present invention, it is preferable that a relationship such that length a<length b be satisfied, where the length a is a length between the fulcrum joint and the first connection arm and the length b is a length between the fulcrum joint and the leg portion, the length a and the length b being measured along the same axis. In this case, the displacement amount of the movable portion can be appropriately adjusted. Moreover, damage, abrasion, and the like of the leg portion and a contact portion (stopper surface) that contacts the leg portion can be reduced.

In the present invention, it is preferable that the physical quantity sensor further include a second connection arm extending from the anchor portion in a direction opposite to the first connection arm, the second connection arm being different from the supporting portion and connecting the anchor portion and the movable portion to each other. In this case, the support mechanism for the movable portion has a more stable structure, the movable portion can more effectively perform translational motion in the height direction, and more precise sensor sensitivity can be obtained.

In the present invention, it is preferable that a proximal end portion of the first connection arm and a proximal end portion of the second connection arm be connected to each other, the proximal end portions being located opposite to connection positions at which the first connection arm and the second connection arms are connected to the movable portion. In this case, when the first connection arm and the second connection arm rotate, the positions of the proximal end portion of the first connection arm and the proximal end portion of the second connection arm in the height direction are prevented from becoming nonuniform, and the movable portion can more stably perform translational motion in the height direction.

In the present invention, it is preferable that the anchor portion, the supporting portion, and the second connection arm be disposed further inward than the movable portion so as to be separated from the movable portion; the anchor portion include a left anchor portion and a right anchor portion arranged in a left-right direction (Y) with a distance therebetween; the supporting portion include a first supporting portion and a second supporting portion, the first supporting portion being connected to the left anchor portion and including the first connection arm extending forward (X1) and the leg portion extending backward (X2) from the left anchor portion, the second supporting portion being connected to the right anchor portion and including the first connection arm extending backward (X2) and the leg portion extending forward (X1) from the right anchor portion; and the second connection arm include a left second connection arm and a right second connection arm, the left second connection arm being located between the left anchor portion and the movable portion and extending in a direction opposite to the first connection arm of the first supporting portion, the right second connection arm being located between the right anchor portion and the movable portion and extending in a direction opposite to the first connection arm of the second supporting portion.

At this time, it is preferable that a middle anchor portion be disposed between the left anchor portion and the right anchor portion, the first supporting portion be connected to both the middle anchor portion and the left anchor portion, and the second supporting portion be connected to both the middle anchor portion and the right anchor portion. In this case, the natural frequency of a mode in which the movable portion is displaced in the height direction and the natural frequency of a mode in which the movable portion is displaced in the left-right direction can be further separated from each other and movement of the movable portion can be stabilized, so that the physical quantity sensor can have a small size, high sensor sensitivity, and high shock resistance.

In the present invention, it is preferable that the middle anchor portion, the left anchor portion, and the right anchor portion be arranged on the same line extending in the left-right direction (Y), and a fixing portion immovably supporting the anchor portions in the height direction of the movable portion be provided.

In this case, the middle anchor portion, the left anchor portion, and the right anchor portion are arranged on the same line extending in the left-right direction (Y) as described above. Therefore, even if the fixing portion becomes distorted due to heat or an external force, the movable portion can easily and appropriately maintain a neutral position.

In the present invention, it is preferable that the detection portion be disposed between a facing portion and the movable portion, the facing portion being a portion that the leg portion approaches when the leg portion is displaced in a direction opposite to the displacement direction of the movable portion.

In the present invention, it is preferable that a facing portion have a stopper surface, the facing portion being a portion that the leg portion approaches when the leg portion is displaced in the direction opposite to the displacement direction of the movable portion; and the stopper surface be a surface of a first protrusion smaller than a width of the leg portion, and the stopper surface face the leg portion at a position further inward than an edge of a distal end surface of the leg portion.

The size of the first protrusion can be effectively reduced by disposing the first protrusion at a position facing an inward part of the leg portion. Therefore, a contact area when the leg portion contacts the stopper surface can be reduced, and an unsticking force when the leg portion becomes separated from the stopper surface can be increased.

In the present invention, it is preferable that the first protrusion be disposed on the facing portion also at a position facing the movable portion.

In the present invention, it is preferable that a second protrusion protruding toward a facing portion be disposed on a facing surface of the leg portion, the facing surface facing the facing portion that the leg portion approaches when the leg portion is displaced in the direction opposite to the displacement direction of the movable portion.

With the present invention, the second protrusion can be made smaller than the first protrusion. Thus, the contact area when the leg portion contacts the stopper surface can be reduced more effectively, and unsticking force when the leg portion becomes separated from the stopper surface can be more effectively increased. Therefore, anti-sticking characteristics can be improved more effectively.

In the present invention, it is preferable that the second protrusion be disposed also on a facing surface of the movable portion, the facing surface facing the facing portion.

In the present invention, it is preferable that the first protrusion or the second protrusion be composed of a plurality of protrusions densely arranged, or both the first protrusion and the second protrusion be composed of a plurality of protrusions densely arranged.

In the present invention, it is preferable that protrusions be formed between the movable portion and a facing portion facing the movable portion in the height direction, the protrusions functioning as stoppers for restricting displacement of the movable portion when the movable portion is displaced toward the facing portion, the protrusions being disposed on both sides of the center of gravity of the movable portion at equal distances.

In the present invention, it is preferable that the leg portions be formed so as to extend to both sides of a center of gravity of the movable portion, protrusions be formed between the leg portions and a facing portion facing the leg portions in the height direction, the protrusions functioning as stoppers for restricting displacement of the movable portion when the leg portions are displaced toward the facing portion, and the protrusions be disposed on both sides of the center of gravity of the movable portion at equal distances.

In this case, when the movable portion contacts or the leg portions contact the protrusions, a reaction force is uniformly applied to the protrusions, and breakage of the protrusions can be appropriately prevented.

With the configurations according to the present invention, a physical quantity sensor having a considerably small size and thickness, high sensor sensitivity, and good anti-sticking characteristics can be provided.

BRIEF DESCRIPTION OF THE DRAWINGS

FIG. 5A is a side view of the physical quantity sensor of FIG. 2, FIG. 5B is a side view of the physical quantity sensor of FIG. 3, and FIG. 5C is a side view of the physical quantity sensor of FIG. 4;

DESCRIPTION OF THE PREFERRED EMBODIMENTS

Figure 1:
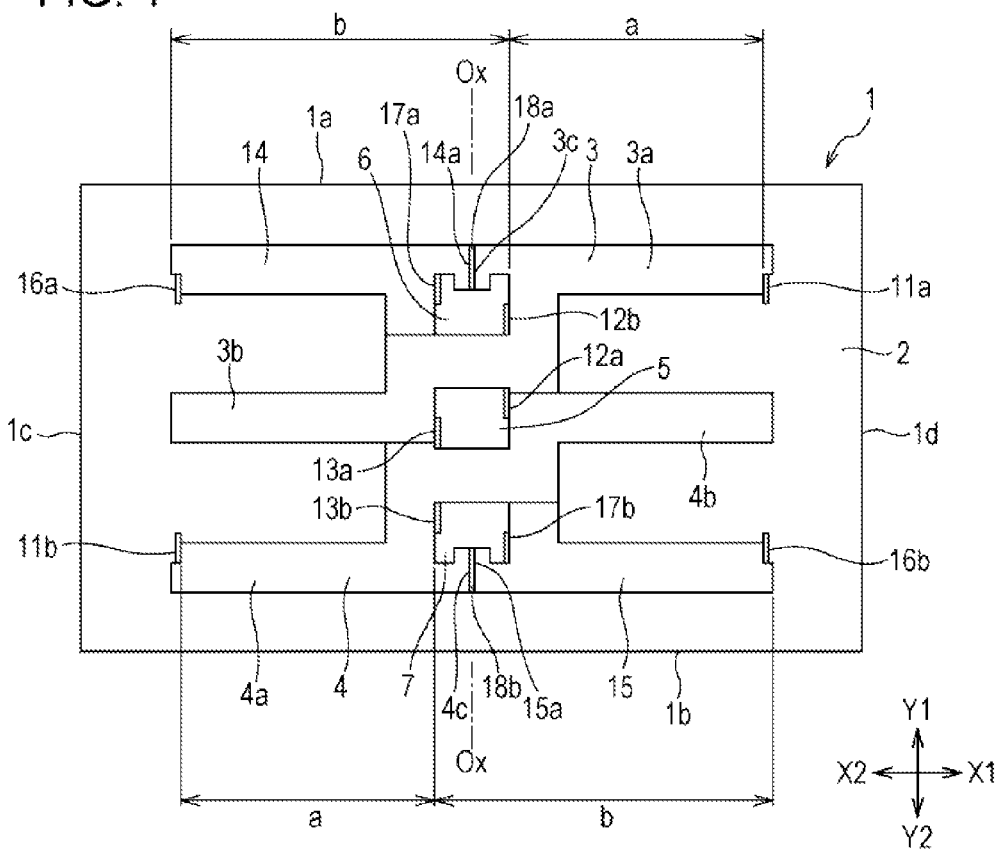
FIG. 1 is a plan view of a physical quantity sensor according to a first embodiment of the present invention.

Regarding physical quantity sensors illustrated in the drawings, the Y direction is the left-right direction, the Y1 direction is the leftward direction, the Y2 direction is the rightward direction, the X direction is the front-back direction, the X1 direction is the forward direction, and the X2 direction is the backward direction. The up-down direction (Z direction; height direction) is a direction that is perpendicular to both the Y direction and the X direction.

Figure 2:
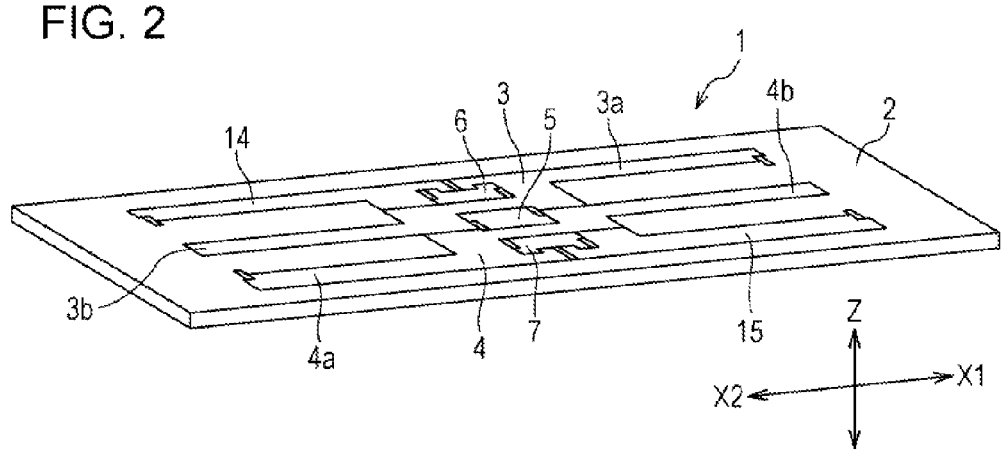
FIG. 2 is a perspective view of the physical quantity sensor according to the first embodiment at rest.

A physical quantity sensor 1 illustrated in FIG. 1 is made of, for example, a silicon substrate having a rectangular plate-like shape. That is, resist layers having planar shapes corresponding to the shapes of components are formed on a silicon substrate, and the components are formed so as to be separated from one another by cutting the silicon substrate at portions at which the resist layers are not present through an etching process such as deep RIE (deep reactive ion etching). Therefore, the components of the physical quantity sensor 1 are disposed within a thickness between the front surface and the back surface of the silicon substrate. As illustrated in FIG. 2, when the physical quantity sensor is in a stationary state, the entire front surface and the entire back surface are each in the same plane, and no parts protrude from the front surface and the back surface.

The physical quantity sensor 1 is very small. For example, the length of long sides 1a and 1b is equal to or smaller than 1 mm, and the length of short sides 1c and 1d is equal to or smaller than 0.8 mm The thickness is equal to or smaller than 0.1 mm.

As illustrated in FIGS. 1 and 2, an outer frame portion of the physical quantity sensor 1 surrounded by the long sides 1a and 1b and the short sides 1c and 1d of the rectangle is a movable portion 2. The direction in which the long sides 1a and 1b extend is the front-back direction, and the direction in which the short sides 1c and 1d extend is the left-right direction.

As illustrated in FIGS. 1 and 2, two supporting portions 3 and 4 are disposed further inward than the movable portion 2. The supporting portions 3 and 4 are crank-shaped in plan view.

As illustrated in FIG. 1, the first supporting portion 3 includes a first connection arm 3a extending forward (X1) and a leg portion 3b extending backward (X2), which are integrally formed. Here, the first connection arm 3a is defined as a part that is located forward (X1) of fulcrum joints 12a and 12b, at which the first supporting portion 3 is connected to a middle anchor portion 5 and a left anchor portion 6. The leg portion 3b is defined as a part that is located backward (X2) of the fulcrum joints 12a and 12b.

As illustrated in FIG. 1, the second supporting portion 4 includes a first connection arm 4a extending backward (X2) and a leg portion 4b extending forward (X1), which are integrally formed. Here, the first connection arm 4a is defined as a part that is located backward (X2) of fulcrum joints 13a and 13b, at which the second supporting portion 4 is connected to the middle anchor portion 5 and a right anchor portion 7. The leg portion 4b is defined as a part that is located forward (X1) of the fulcrum joints 13a and 13b.

The first connection arms 3a and 4a and the leg portions 3b and 4b have predetermined widths and extend away from the anchor portions 5 to 7 in directions parallel to the front-back direction (X1-X2 direction). For example, as illustrated in FIG. 1, the first connection arms 3a and 4a and the leg portions 3b and 4b of the supporting portions 3 and 4 have approximately the same width (in the Y1-Y2 direction).

As illustrated in FIG. 1, the first supporting portion 3 and the second supporting portion 4 are point symmetric. Thus, with respect to the anchor portions 5 to 7, the first connection arm 3a of the first supporting portion 3 and the first connection arm 4a of the second supporting portion 4 extend in opposite directions, and the leg portion 3b of the first supporting portion 3 and the leg portion 4b of the second supporting portion 4 extend in opposite directions.

As illustrated in FIG. 1, the middle anchor portion 5, the left anchor portion 6, and the right anchor portion 7 are disposed further inward than the movable portion 2. As illustrated in FIG. 1, when a line that extends in the left-right direction (Y) and that passes through the midpoints of the short sides 1c and 1d of the physical quantity sensor 1 is defined as a transversal center line Ox, the midpoints of the middle anchor portion 5, the left anchor portion 6, and the right anchor portion 7, at which the anchor portions 5 to 7 are respectively bisected in the front-back direction, are on the transversal center line Ox. The widths of the middle anchor portion 5, the left anchor portion 6, and the right anchor portion 7 in the front-back direction (X) are substantially the same.

For example, the anchor portions 5 to 7 are immovably supported by a fixing portion (support substrate) 10 illustrated in FIG. 5A. The fixing portion 10 is, for example, a silicon substrate. An oxide insulation layer (SiO2 layer), which is not shown, is disposed between each of the anchor portions 5 and 7 and the fixing portion 10. The fixing portion 10 and the oxide insulation layer; and a silicon substrate that forms the movable portion 2, the supporting portions 3 and 4, the anchor portions 5 to 7, and the like, which are illustrated in FIG. 1, are each, for example, a SOI substrate. In a stationary state illustrated in FIG. 5A, the distance T1 between the movable portion 2 and the fixing portion 10 is in the range of about 1 to 5 μm.

As illustrated in FIGS. 1 and 2, the movable portion 2, the supporting portions 3 and 4, and the anchor portions 5 to 7 are formed so as to be separated from one another. As described above, an oxide insulation layer is interposed between the fixing portion 10 and each of the anchor portions 5 to 7, and the anchor portions 5 to 7 are immovably supported by the fixing portion 10. An oxide insulation layer is not present between the movable portion 2 and the fixing portion 10 and between the supporting portions 3 and 4 and the fixing portion 10. There is a space between the movable portion 2 and the fixing portion 10 and between the supporting portions 3 and 4 and the fixing portion 10 (FIG. 5A).

As illustrated in FIG. 1, a distal end portion of the first connection arm 3a of the first supporting portion 3 is rotatably connected to the movable portion 2 through a joint 11a. A distal end portion of the first connection arm 4a of the second supporting portion 4 is rotatably connected to the movable portion 2 through a joint 11b.

As illustrated in FIG. 1, the first connection arm 3a of the first supporting portion 3 bifurcates at a position near the left anchor portion 6. A portion of the first connection arm 3a between the left anchor portion 6 and the middle anchor portion 5 is rotatably connected to both the middle anchor portion 5 and the left anchor portion 6 through the fulcrum joints 12a and 12b. As illustrated in FIG. 1, the first connection arm 4a of the second supporting portion 4 bifurcates at a position near the right anchor portion 7. A portion of the first connection arm 4a between the right anchor portion 7 and the middle anchor portion 5 is rotatably connected to the middle anchor portion 5 and to the right anchor portion 7 through the fulcrum joints 13a and 13b.

In the embodiment illustrated in FIG. 1, a left second connection arm 14, which is formed so as to be separated from the movable portion 2 and the left anchor portion 6, is disposed backward (X2) of the left anchor portion 6. A right second connection arm 15, which is formed so as to be separated from the movable portion 2 and the right anchor portion 7, is disposed forward (X1) of the right anchor portion 7. The left second connection arm 14 and the right second connection arm 15 are disposed further inward than the movable portion 2. The left second connection arm 14 and the right second connection arm 15 are point symmetric. The left second connection arm 14 and the right second connection arm 15 have predetermined widths and extend away from the left anchor portion 6 and the right anchor portion 7 in directions parallel to the front-back direction (X1-X2 direction). It is preferable that the widths (in the Y1-Y2 direction) of the left second connection arm 14 and the right second connection arm 15 be the same as the widths of the first connection arms 3a and 4a.

As illustrated in FIG. 1, a distal end portion of the left second connection arm 14 is rotatably connected to the movable portion 2 through a joint 16a. A distal end portion of the right second connection arm 15 is rotatably connected to the movable portion 2 through a joint 16b. As illustrated in FIG. 1, the left second connection arm 14 is rotatably connected to the left anchor portion 6 through a fulcrum joint 17a. The right second connection arm is rotatably connected to the right anchor portion 7 through a fulcrum joint 17b.

As illustrated in FIG. 1, the first connection arm 3a of the first supporting portion 3 and the left second connection arm 14 respectively include proximal end portions 3c and 14a, which extend to the left side (Y1) of the left anchor portion 6. The proximal end portion 3c of the first connection arm 3a and the proximal end portion 14a of the left second connection arm 14 face each other with a predetermined distance therebetween. The proximal end portion 3c of the first connection arm 3a and the proximal end portion 14a of the left second connection arm 14 are connected to each other through a joint 18a. As illustrated in FIG. 1, the first connection arm 4a of the second supporting portion 4 and the right second connection arm 15 respectively include proximal end portions 4c and 15a, which extend to the right side (Y2) of the right anchor portion 7. The proximal end portion 4c of the first connection arm 4a and the proximal end portion 15a of the right second connection arm 15 face each other with a predetermined distance therebetween. The proximal end portion 4c of the first connection arm 4a and the proximal end portion 15a of the right second connection arm 15 are connected to each other through a joint 18b.

The length of the first connection arm 3a of the first supporting portion 3 from the distal end portion to the proximal end portion 3c in the X1-X2 direction, the length of the first connection arm 4a of the second supporting portion 4 from the distal end portion to the proximal end portion 4c in the X1-X2 direction, the length of the left second connection arm 14 from the distal end portion to the proximal end portion 14a in the X 1-X2 direction, and the length of the right second connection arm 15 from the distal end portion to the proximal end portion 15a in the X1-X2 direction are adjusted to be the same.

Figure 6:
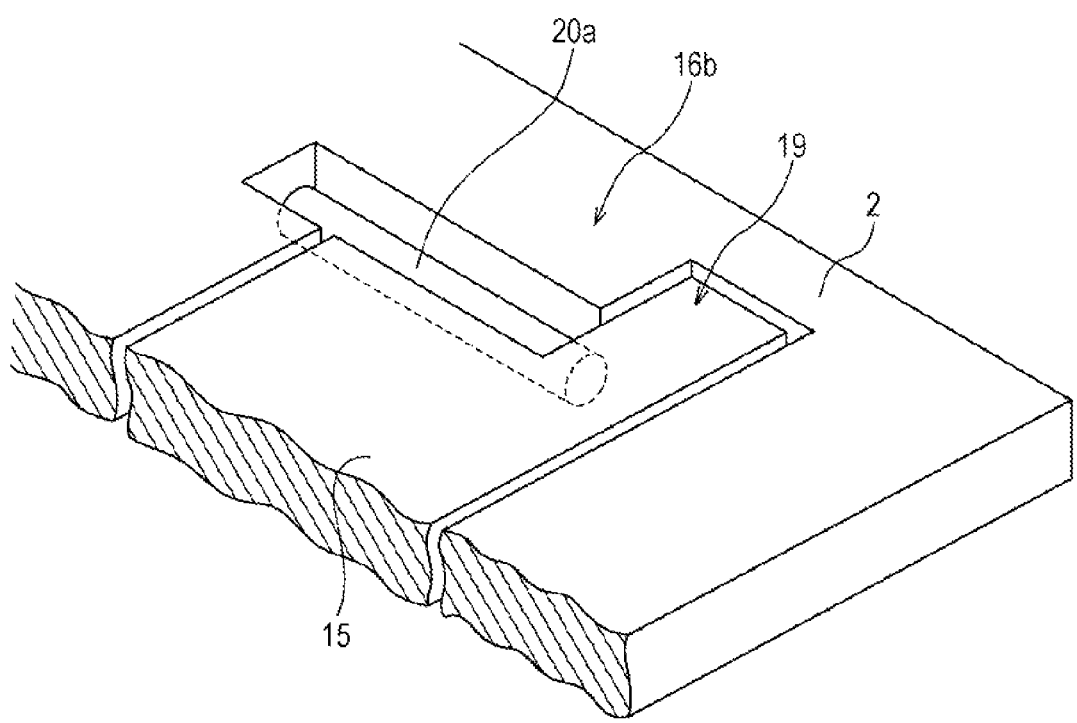
FIG. 6 is a partial enlarged perspective view illustrating a vicinity of a joint illustrated in FIG. 1.

FIG. 6 is a partial enlarged perspective view of a vicinity of the joint 16b illustrated in FIG. 1.

As illustrated in FIG. 6, a groove 19 is formed in the movable portion 2 at the joint 16a. A torsion bar (spring portion) 20a, which connects the right second connection arm 15 and the movable portion 2 to each other, is disposed in the groove 19. The torsion bar 20a is made of silicon, as with the movable portion 2 and the right second connection arm 15. That is, when forming the movable portion 2 and the right second connection arm 15 so as to be separated from each other by etching a rectangular silicon substrate, the torsion bar 20a is formed by leaving a part of the silicon substrate unetched so that the unetched part connects the movable portion 2 and the right second connection arm 15 to each other and by processing the unetched part into a cylindrical or prismatic shape. In FIG. 6, the thickness of the torsion bar 20a is smaller than the thickness of the movable portion 2. However, the thicknesses may be the same. That is, spring characteristics can be provided by etching and thereby cutting a part of the silicon substrate to become the torsion bar 20a into a small-width shape.

The joints 11a, 11b, and 16a illustrated in FIG. 1 each have a structure similar to that illustrated in FIG. 6.

Figure 7:
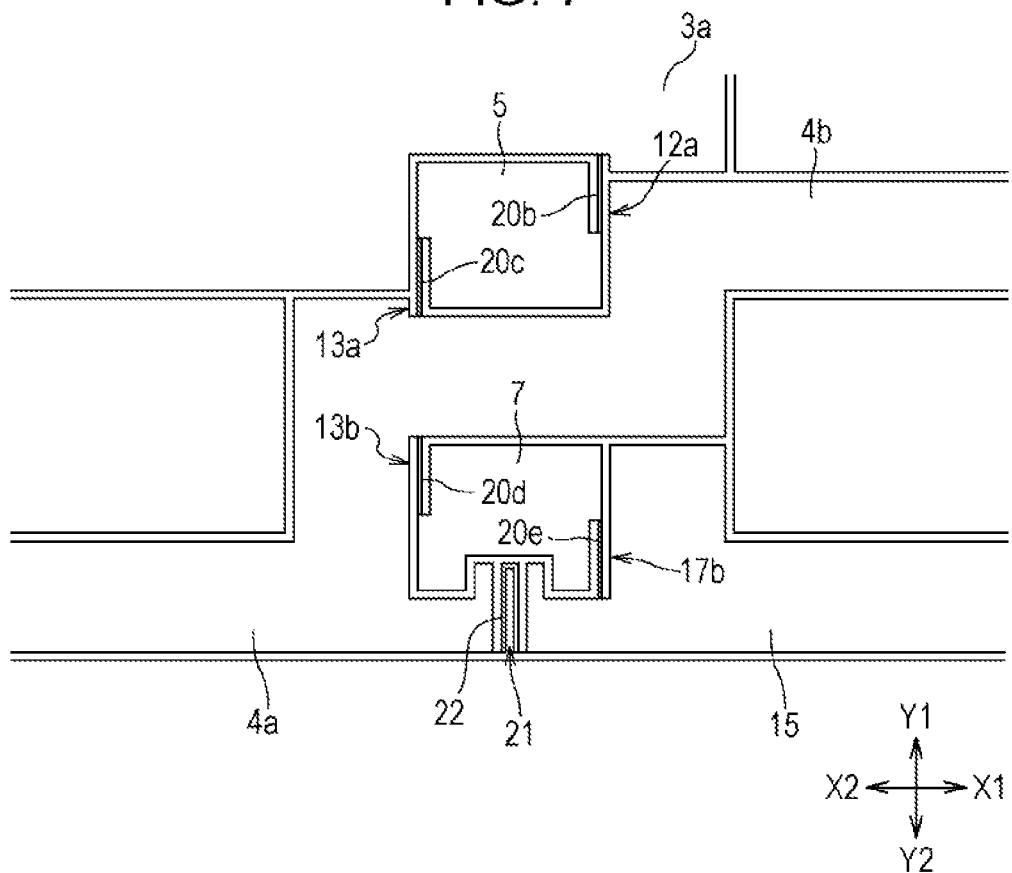
FIG. 7 is an enlarged partial plan view of the physical quantity sensor illustrated in FIG. 1.

FIG. 7 is an enlarged partial plan view of a vicinity of the middle anchor portion 5, the right anchor portion 7, and the vicinity thereof.

As illustrated in FIG. 7, the fulcrum joints 12a, 13a, 13b, and 17b have torsion bars 20b to 20e disposed in grooves. The anchor portions 5 and 7, the first connection arms 3a and 4a, and the right second connection arm 15 are connected to each other through the torsion bars 20b to 20e. Though not illustrated, the fulcrum joints 12b and 17a, through which the left anchor portion 6 and the first connection arm 3a and the left second connection arm 14 are connected, each have a structure similar to that of FIG. 7.

As illustrated in FIGS. 1 and 7, the torsion bars disposed in the joints 11a and 16b are coaxial in the left-right direction (Y). The torsion bars disposed in the joints 16a and 11b are coaxial in the left-right direction (Y). The torsion bars disposed in the fulcrum joints 12a, 12b, and 17b are coaxial in the left-right direction (Y). The torsion bars disposed in the fulcrum joints 13a, 13b, and 17a are coaxial in the left-right direction (Y).

As illustrated in FIG. 7, a spring portion 22 having a bent shape is disposed in a groove 21 in a joint 18b, which is located between the proximal end portion 15a of the right second connection arm 15 and the proximal end portion 4c of the first connection arm 4a of the second supporting portion 4. One end of the spring portion 22 is connected to the proximal end portion 15a of the right second connection arm 15, and the other end of the spring portion 22 is connected to the proximal end portion 4c of the first connection arm 4a of the second supporting portion 4. The spring portion 22 does not extend parallel to the front-back direction (X) but has a bent shape, so that the spring portion 22, which has a small width, has a large length and a small spring constant and thereby the first connection arm and the second connection arm are not strongly connected to each other through the spring portion 22. The spring portions disposed in the joints 18a and 18b are coaxial in the left-right direction (Y). The spring portion disposed in the joint 18a and the spring portion disposed in the joint 18b are point symmetric.

The torsion bars 20a to 20e and the spring portion 22 can be torsionally deformed, and thereby the connection arms can be rotated relative to the movable portion 2 and the anchor portions 5 to 7. Silicon, which is the material of the torsion bars 20a to 20e and the spring portion 22, is an elastic material. Therefore, as illustrated in FIGS. 1 and 2, when an external force is not acting on the movable portion 2 and the like, the surface of the movable portion 2 and the surfaces of the connection arms and the leg portions recover to be in the same plane due to elastic recovery forces of the torsion bars 20a to 20e and the spring portion 22.

As illustrated in FIG. 5A, the physical quantity sensor 1 includes a facing portion (facing portion; cover member) 30 disposed at a position separated from one side of the movable portion 2 in the height direction and the fixing portion 10 disposed at a position separated from the other side of the movable portion 2 in the height direction. In a stationary state illustrated in FIG. 5A, the distance T2 between the movable portion 2 and the facing portion 30 is in the range of about 1 to 5 μm.

Although not illustrated in FIG. 5A, a fixed electrode is disposed on a surface 30a of the facing portion 30. The facing portion 30 is, for example, a silicon substrate. The fixed electrode is formed by sputtering or plating an electrically conductive metal material on the surface 30a of the facing portion 30 with an insulation layer therebetween.

A movable electrode (not shown), which faces the fixed electrode formed on the facing portion 30, is formed on a surface (lower surface) 2a of the movable portion 2 with an insulation layer therebetween by a sputtering or plating process. If the movable portion 2 is made of an electrically conductive material such as a low-resistance silicon substrate, the movable portion 2 itself can be used as the movable electrode.

As illustrated in FIGS. 2 and 5A, when an external force (acceleration or the like) is not acting on the physical quantity sensor 1, the surfaces of all components are maintained in the same plane due to elastic recovery forces of the torsion bars and the spring portions disposed in the fulcrum joints and the joints.

For example, when acceleration is applied to the physical quantity sensor 1 from the outside, the acceleration acts on the movable portion 2 and the anchor portions 5 to 7. At this time, the movable portion 2 tends to remain in an absolute space due to an inertial force. As a result, the movable portion 2 moves relative to the anchor portions 5 to 7 in a direction opposite to the direction in which the acceleration is applied.

Figure 3:
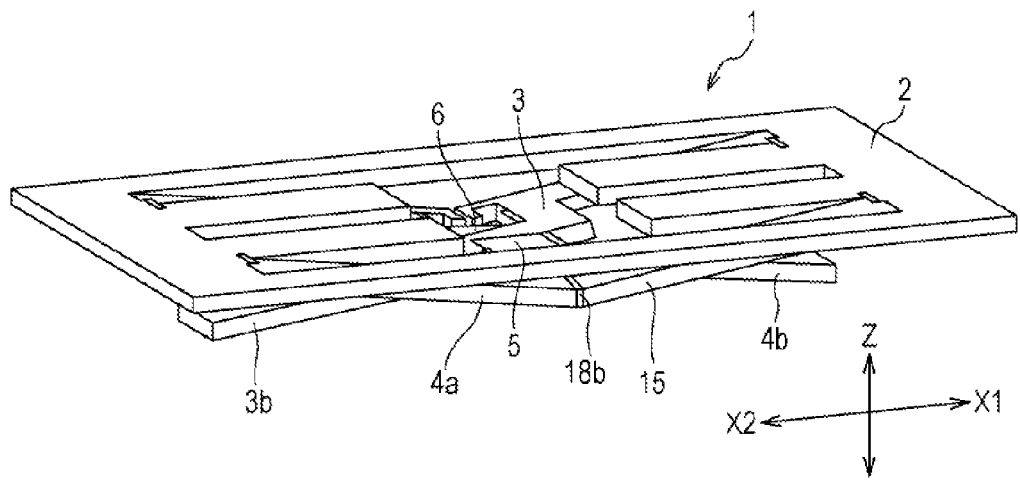
FIG. 3 is a perspective view of the physical quantity sensor according to the first embodiment in motion.

FIGS. 3 and 5B illustrate movement that occurs when downward acceleration is applied to the anchor portions 5 to 7, the fixing portion 10, and the facing portion 30. At this time, the movable portion 2 tends to move upward from the position in a stationary state illustrated in FIGS. 2 and 5A due to an inertial force. As a result, the first supporting portion 3 rotates around the fulcrum joints 12a and 12b in the height direction, the second supporting portion 4 rotates around the fulcrum joints 13a and 13b in the height direction, the left second connection arm 14 rotates around the fulcrum joint 17a in the height direction, and the right second connection arm 15 rotates around the fulcrum joint 17b in the height direction. As illustrated in FIG. 1 and other figures, the width of the supporting portions 3 and 4 and the second connection arms 14 and 15 in the left-right direction (Y) is sufficiently larger than the width of the torsion bars, and the supporting portions 3 and 4 and the second connection arms 14 and 15 have high rigidity. Therefore, when the movable portion 2 is displaced in the height direction, the supporting portions 3 and 4 and the second connection arms 14 and 15 themselves are hardly, for example, bent or twisted, so that the supporting portions 3 and 4 and the second connection arms 14 and 15 appropriately rotate while maintaining substantially rectangular-parallelepiped shapes. During this rotational movement, the torsion bars disposed in the joints 11a, 11b, 16a, and 16b and the torsion bars disposed in the fulcrum joints 12a, 12b, 13a, 13b, 17a, and 17b are torsionally deformed. Moreover, as illustrated in FIGS. 1, 3, and 5B, the proximal end portion 14a of the left second connection arm 14 and the proximal end portion 3c of the first connection arm 3a of the first supporting portion 3 are connected to each other through the spring portion, and the proximal end portion 15a of the right second connection arm 15 and the proximal end portion 4c of the first connection arm 4a of the second supporting portion 4 are connected to each other through the spring portion. Therefore, as illustrated in FIGS. 3 and 5B, when the movable portion 2 is displaced in the height direction, the positions of the proximal end portion 14a and 15a of the second connection arms 14 and 15 in the height direction and the positions of the proximal end portions 3c and 4c of the first connection arms 3a and 4a in the height direction are prevented from becoming nonuniform.

Due to the support mechanism for supporting the movable portion 2 according to the present embodiment, the movable portion 2 can effectively perform translational motion in the height direction.

As illustrated in FIGS. 3 and 5B, when the first supporting portion 3 rotates around the fulcrum joints 12a and 12b in the height direction and the second supporting portion 4 rotates around the fulcrum joints 13a and 13b in the height direction, the distal end portions of the first connection arms 3a and 4a are displaced upward and the distal end portions of the leg portions 3b and 4b are displaced downward. As illustrated in FIGS. 3 and 5B, distal end portions 31 and 32 of the leg portions 3b and 4b protrude further downward than the positions of the anchor portions 5 to 7.

Figure 4:
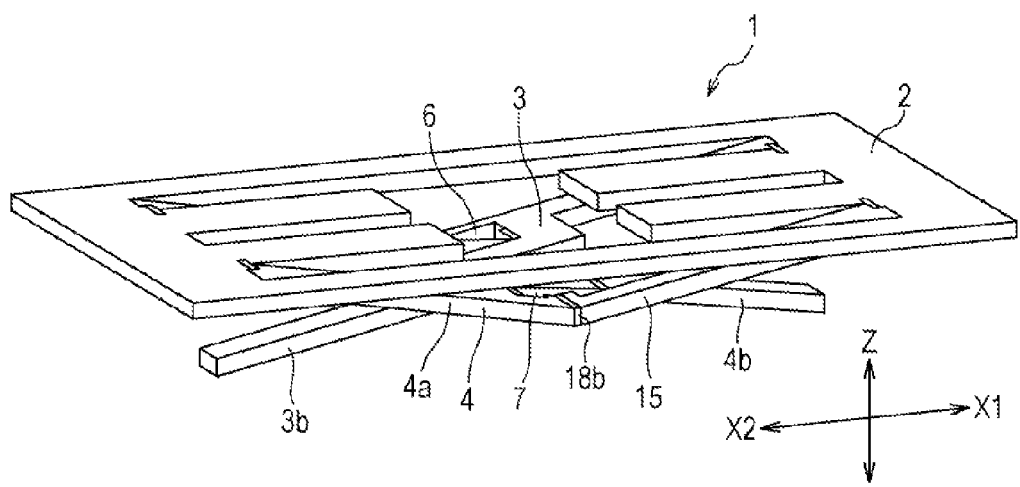
FIG. 4 is a perspective view of the physical quantity sensor according to the first embodiment in motion.

When acceleration is applied further and the movable portion 2 is displaced upward, the first supporting portion 3 and the second supporting portion 4 rotate further, and the protruding amounts of the distal end portions 31 and 32 of the leg portions 3b and 4b from the anchor portions 5 to 7 increase further (see FIGS. 4 and 5C). At this time, as illustrated in FIG. 5C, the distal end portions 31 and 32 of the leg portions 3b and 4b contact the surface (stopper surface) 30a of the facing portion 30 before the movable portion 2 contacts a surface 10a of the fixing portion 10. As a result, the movable portion 2 cannot be displaced further upward from the state illustrated in FIG. 5C, so that displacement of the movable portion 2 is restricted. That is, the movable portion 2 does not contact the surface 10a of the fixing portion 10. Thus, the stopper mechanism for restricting displacement of the movable portion 2 is constituted by the leg portions 3b and 4b and the surface (stopper surface) 30a of the facing portion 30.

As described above, in the present embodiment, the leg portions 3b and 4b, which can be displaced in a direction opposite to the displacement direction of the movable portion 2, are provided, and the stopper mechanism for restricting displacement of the movable portion 2 is provided. As a result, even if a strong physical quantity acts on the movable portion 2 or a physical quantity acts on the movable portion 2 for a long time, load and damage to the joints can be reduced. Moreover, because the stopper mechanism restricts displacement of the movable portion 2 before the movable portion 2 contacts the surface 10a of the fixing portion 10, a fault such as collision of the movable portion 2 with the fixing portion 10 can be prevented.

Therefore, with the configuration of the physical quantity sensor 1 according to the present embodiment, precise and high sensor sensitivity can be obtained by using a simple structure.

Figure 8:
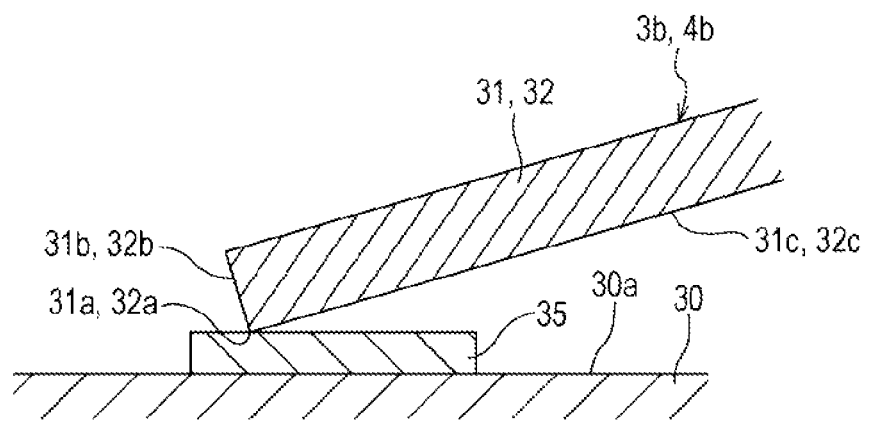
FIG. 8 is a partial enlarged sectional view illustrating a state in which a leg portion according to the present embodiment is in contact with a stopper surface.

As illustrated in FIG. 5C, in the present embodiment, the distal end portions 31 and 32 of the leg portions 3b and 4b contact the surface 30a of the facing portion 30. Therefore, anti-sticking characteristics can be improved more effectively than in cases where surface contact occurs. As illustrated in FIG. 8, it is preferable that edges 31a and 32a of the distal end portions 31 and 32 of the leg portions 3b and 4b (the intersections of distal end surfaces 31b and 32b and lower surfaces (surfaces facing the facing portion) 31c and 32c) have convexly rounded shapes, because, in this case, damages to the leg portions 3b and 4b or to a base 35 disposed on the surface 30a of the facing portion 30 can be reduced.

As illustrated in FIG. 1, with the present embodiment, the leg portions 3b and 4b, which move in a direction opposite to the displacement direction of the movable portion 2, can be simply and appropriately formed by processing a planar substrate in the thickness direction so as to draw and form the planar shapes illustrated in FIG. 1 by performing etching or the like. Therefore, a stopper and sticking prevention structure that is simpler than existing structures described in Japanese Unexamined Patent Application Publication Nos. 2005-283393, 2008-197113, 9-127151 can be realized.

Moreover, according to the present embodiment, the physical quantity sensor 1 can be reduced in size and thickness. That is, the size of the physical quantity sensor 1 is small in plan view because the leg portions 3b and 4b can be disposed further inward than the movable portion 2 in plan view. Regarding the thickness direction, the supporting portions 3 and 4 having the leg portions 3b and 4b can be formed within the thickness of the silicon substrate. The thickness of the physical quantity sensor 1 can be reduced by reducing the distance T2 between the movable portion 2 and the facing portion 30 in a stationary state illustrated in FIG. 5A. Even if the distance T2 between the movable portion 2 and the facing portion 30 is reduced, displaceable range of the movable portion 2 can be adjusted to a predetermined amount by adjusting the length of the leg portions 3b and 4b in the front-back direction (X), whereby predetermined sensor sensitivity can be maintained. As illustrated in FIG. 8, the base 35 (which can function as, for example, a fixed electrode) may be disposed on the surface 30a of the facing portion 30, and the distal end portions 31 and 32 of the leg portions 3b and 4b may contact the surface of the base 35 (which serves as a stopper surface). In this case, the distance T2 between the movable portion 2 and the facing portion 30 and the length of the leg portions 3b and 4b in the front-back direction (X) are adjusted with consideration of the thickness of the base 35. In FIG. 8, the base 35 is disposed at a position at which the base 35 contacts the distal end portions 31 and 32 of the leg portions 3b and 4b. To make the base 35 function as a fixed electrode, it is necessary that the base 35 be disposed at a position facing the movable portion 2 in the height direction. In this case, instead of the position illustrated in FIG. 8, the base 35 may be disposed at a position at which the base 35 does not contact the distal end portions 31 and 32 of the leg portions 3b and 4b. In such a case, the distal end portions 31 and 32 of the leg portions 3b and 4b contact the surface 30a of the facing portion 30.

As illustrated in FIG. 5, the physical quantity sensor 1 according to the present embodiment is disposed so that the movable portion 2 is displaced above the anchor portions 5 to 7 due to the action of a physical quantity. However, in the case where the movable portion 2 is displaced below the anchor portions 5 to 7 due to the action of the physical quantity, the physical quantity sensor 1 according to the present embodiment may be flipped upside down from the state illustrated in FIG. 5A and used. The movable portion 2 may be displaced above and below the anchor portions 5 to 7 due to the action of a physical quantity. In such a case, the distance T1 between the movable portion 2 and the surface 10a of the fixing portion 10 in a stationary state illustrated in FIG. 5A may be reduced to a distance that is about the same as the distance T2 between the movable portion 2 and the surface 30a of the facing portion 30. Alternatively, a protrusion (not shown) or the like may be disposed on the surface 30a of the facing portion 30, so that the movable portion 2 may not directly contact the surface 30a of the facing portion 30 even when the movable portion 2 is displaced downward.

In the embodiment illustrated in FIG. 1, the middle anchor portion 5, the left anchor portion 6, and the right anchor portion 7 are provided. The centers of the anchor portions 5 to 7 are disposed on the transversal center line Ox extending in the left-right direction (Y). Therefore, the fulcrum joints 12a, 12b, 13a, 13b, 17a, and 17b are not separated from the transversal center line Ox by a large distance in the front-back direction. Thus, for example, even if the fixing portion 10, which immovably supports the anchor portions 5 to 7, becomes distorted due to heat or an external force, the fulcrum joints 12a, 12b, 13a, 13b, 17a, and 17b are prevented from being moved in the up-down direction by a large distance. Therefore, the movable portion 2 is prevented from being displaced in the up-down direction from a neutral position at which acceleration or the like is not acting on the movable portion 2, so that offset noise (an output due to displacement from the neutral position) can be reduced.

Figure 9:
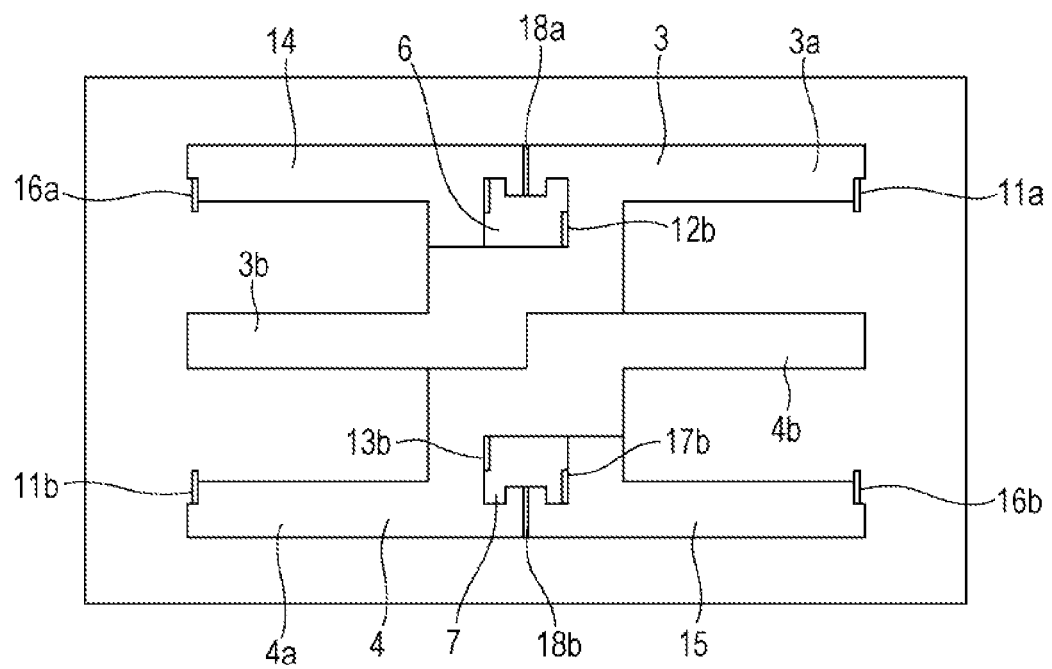
FIG. 9 is a plan view of a physical quantity sensor according to a second embodiment of the present invention.
Figure 9:
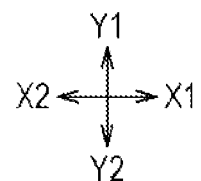

As illustrated in FIG. 9, only the left anchor portion 6 and the right anchor portion 7 may be provided as anchor portions, and the middle anchor portion 5 may be omitted. In this case, the physical quantity sensor can have high sensor sensitivity and anti-sticking characteristics as with the physical quantity sensor 1 according to the embodiment illustrated in FIG. 1. In FIG. 9, the components the same as those of those of FIG. 1 are denoted by the same numerals.

However, as illustrated in Table 1 below, in the physical quantity sensor illustrated in FIG. 9, from which the middle anchor portion 5 is omitted, the natural frequency in the height direction (Z) is close to the natural frequency in the left-right direction (Y), so that movement of the movable portion 2 becomes unstable. As a result, problems of decrease in sensor sensitivity and breakage due to collision may arise.

In contrast, with the embodiment illustrated in FIG. 1, which includes the left anchor portion 6, the right anchor portion 7, and the middle anchor portion 5, the difference between the spring constants of the vibration mode in the height direction (Z) and the vibration mode in the left-right direction (Y) is large, so that the natural frequency in the height direction (Z) and the natural frequency in the left-right direction (Y) can be effectively separated from each other, whereby movement of the movable portion 2 can be made stable and the physical quantity sensor 1 having a small size, high sensor sensitivity, and high shock resistance can be provided.

TABLE 1

| | Natural Frequency (kHz) | |
|---|---|---|
| Vibration Mode in Z direction | 2.56 (FIG. 9) | 2.57 (FIG. 1) |
| Vibration Mode in Y direction | 3.37 (FIG. 9) | 5.00 (FIG. 1) |

As illustrated in FIG. 1, for the supporting portions 3 and 4 in the present embodiment, a relationship such that length a<length b holds, where the length a is the distance from the fulcrum joints 12b and 13b to the distal ends of the first connection arms 3a and 4a in the front-back direction (X1-X2) and the length b is the distance from the fulcrum joints 12b and 13b to the distal ends of the leg portions 3b and 4b in the front-back direction (X1-X2). The length of the second connection arms 14 and 15 from the fulcrum joints 17a and 17b to the distal ends in the front-back direction (X1-X2) is the same as the length a.

Thus, the leg portions 3b and 4b can appropriately function as a stopper mechanism, and the movable portion 2 can be stably displaced in the height direction. By changing the ratio of the length a to the length b, the maximum displacement amount of the movable portion 2 can be easily and appropriately adjusted. As illustrated in FIG. 5C, the lengths are adjusted so that the movable portion 2 may not contact the surface 10a of the fixing portion 10. By setting length a<length b, the strength of an inertial force that can be supported by the same contact force when the state illustrated in FIG. 5C occurs due to acceleration can be increased. As a result, the leg portions 3b and 4b and the surface 30a of the facing portion 30, which contacts the leg portions 3b and 4b, are less likely to be abraded or damaged.

On the contrary, if length a>length b, the maximum displacement amount of the movable portion 2 can be increased, although the strength of an inertial force that can be supported by the same contact force decreases.

Figure 10A:
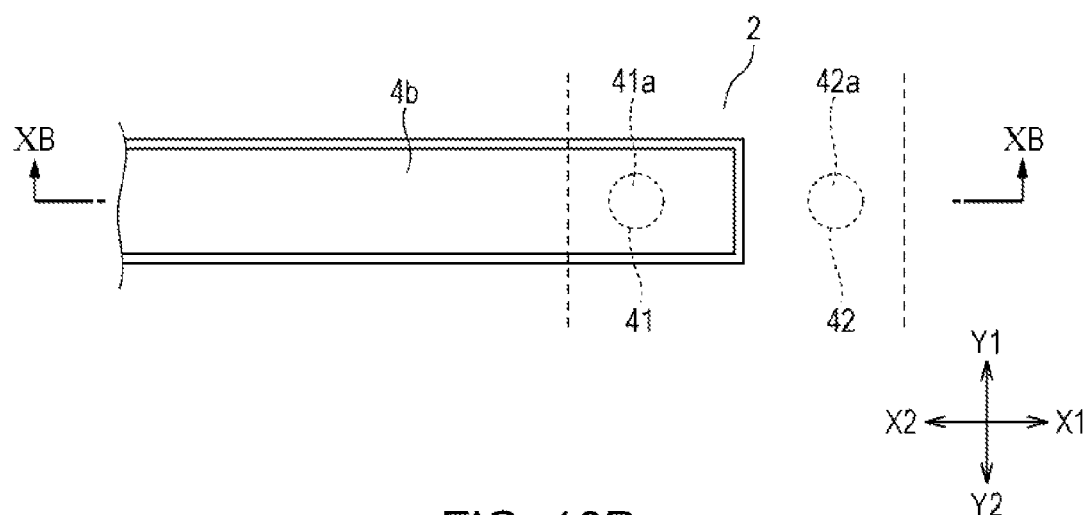
FIGS. 10A to 10C illustrate a preferable stopper structure according to the present invention, FIG. 10A being an enlarged partial plan view, FIG. 10B being a partial sectional view taken along line XB-XB of FIG. 10A and illustrating a state in which a leg portion is in contact with a stopper surface, FIG. 10C being a partial sectional view illustrating a state in which a movable portion is in contact with a stopper surface.
Figure 10B:
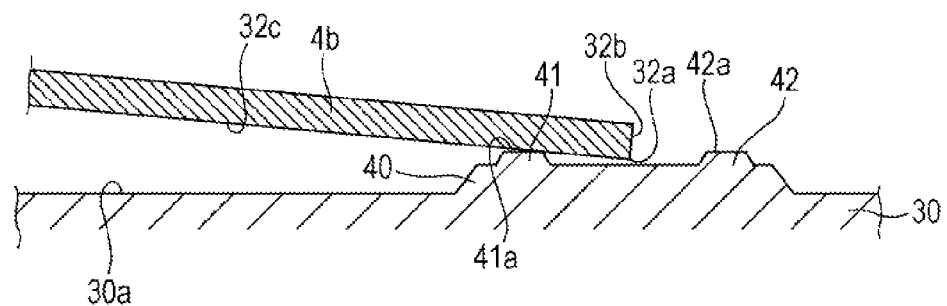
Figure 10C:
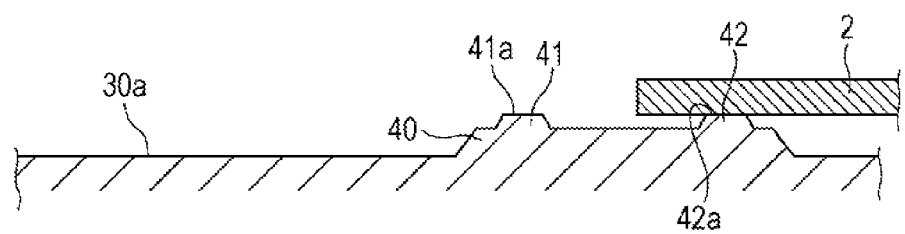

FIGS. 10A to 10C illustrate a preferred embodiment of a stopper mechanism. FIG. 10A is an enlarged partial plan view of the vicinity of, for example, the leg portion 4b. FIGS. 10B and 10C are partial enlarged sectional views taken along line XB-XB of FIG. 10A and seen in the direction of arrows. Although only the leg portion 4b will be described below, a similar stopper mechanism is disposed in the vicinity of the leg portion 3b.

As illustrated in FIGS. 10A and 10B, a base 40 for height adjustment is formed like a mound on a certain region of the surface 30a of the facing portion 30, and two first protrusions 41 and 42 protrude from the surface of the base 40. Surfaces 41a and 42a of the first protrusions 41 and 42 serve as stopper surfaces (hereinafter referred to as stopper surfaces 41a and 42a).

As illustrated in FIG. 10A, the width of the stopper surfaces 41a and 42a is sufficiently smaller than that of the leg portion 4b. Although the stopper surface 41a in FIG. 10A has a substantially circular shape, the shape of the stopper surface 41a in plan view is not particularly limited. The "width" of the stopper surface 41a is the dimension of the stopper surface 41a in a direction the same as that of the width of the leg portion 4b in the left-right direction (Y1-Y2). If the stopper surface 41a is circular as illustrated in FIG. 10, the width corresponds to the diameter. The width of the stopper surface 41a is about several micrometers.

A method of forming the base 40 and the first protrusions 41 and 42 is not limited. For example, they may be formed by etching the surface 30a of the facing portion 30.

As illustrated in FIGS. 10A and 10B, the stopper surface 41a, which is one of the two stopper surfaces 41a and 42a, is formed so as to face a part of the leg portion 4b that is further inward than the edge 32a along which the distal end surface 32b and the lower surface (the surface opposite the facing portion 30) 32c intersect.

Therefore, as illustrated in FIG. 10B, when the leg portion 4b is displaced downward and the leg portion 4b contacts the stopper surface 41a, the lower surface (the surface facing the facing portion 30) 32c of the leg portion 4b contacts the stopper surface 41a at a position that is further inward than the edge 32a.

On the other hand, in the configuration illustrated in FIG. 13, a stopper surface 43a is disposed at a position facing the edge 32a of the leg portion 4b, and the edge 32a contacts the stopper surface 43a. In FIG. 13, the surface of the base 43 mounded on the surface 30a of the facing portion 30 is the stopper surface 43a. To stably perform stopper function, the stopper surface 42a has a large area so that the entire edge 32a can contact the stopper surface 43a, whereby the contact area between the stopper surface 42a and the leg portion 4b tends to increase.

In contrast, in the configuration illustrated in FIG. 10, the first protrusion 41, which has a width smaller than that of the leg portion 4b, is formed at a position facing an inward part of the leg portion 4b, and the surface of the first protrusion 41 serves as the stopper surface 41a. Thus, when the leg portion 4b contacts the stopper surface 41a at a position further inward than the edge 32a, the leg portion 4b and the stopper surface 41a point-contact or line-contact each other in a sufficiently small region, whereby the contact area between the leg portion 4b and the stopper surface 41a can be made smaller that of the configuration illustrated in FIG. 13. In the configuration illustrated in FIG. 10, the stopper surface 41a contacts an inward part of the leg portion 4b. Therefore, as illustrated in FIG. 10B, even if the first protrusion 41 has a small width, the leg portion 4b and the stopper surface 41a can be easily disposed so as to face each other and appropriately (stably) contact each other.

FIG. 10C illustrates a case where the movable portion 2 contacts the stopper surface 42a of the first protrusion 42, which is the other one of the two first protrusions. Also in the case of FIG. 10C, the contact area between the movable portion 2 and the stopper surface 42a can be appropriately reduced.

FIG. 11 illustrates a further preferred embodiment, in which a second protrusion 45 that protrudes toward the facing portion 30 is formed on the lower surface 32c of the leg portion 4b. Moreover, a second protrusion 46 that protrudes toward the facing portion 30 is formed on a lower surface of the movable portion 2.

Because the second protrusions 45 and 46 are formed on the leg portion 4b and the movable portion 2, the width of the second protrusions 45 and 46 can be effectively made smaller than the width of the first protrusions 41 and 42.

A silicon substrate that forms the movable portion 2 is, for example, a SOI substrate that is separated from the fixing portion 10 (see FIG. 5) with an insulation layer (sacrificial layer) therebetween. To remove an unnecessary insulation layer (sacrificial layer), multiple pores are formed in the movable portion 2 and the supporting portions 3 and 4, and etching liquid or etching gas is injected through the pores, and thereby the unnecessary insulation layer is removed.

In the configuration illustrated in FIG. 10, the first protrusions 41 and 42 are formed on the facing portion 30. In this case, for example, if the facing portion 30 and the silicon substrate forming the movable portion 2 are misaligned with each other and when the leg portion 4b and the movable portion 2 illustrated in FIGS. 10B and 10C contact the first protrusions 41 and 42, the pores formed in the leg portion 4b and the movable portion 2 may be located so as to face the first protrusions 41 and 42. At this time, if the first protrusions 41 and 42 are too small, interference between the first protrusions 41 and 42 the pores may occur (the first protrusions 41 and 42 may be partially inserted into the pores), so that the protrusions 41 and 42 may not appropriately function as a stopper mechanism.

In contrast, with the configuration illustrated in FIG. 11, in which the second protrusions 45 and 46 are disposed on the movable portion 2 and the leg portion 4b, the second protrusions 45 and 46 can be precisely formed so as to avoid the positions of the pores. Therefore, the second protrusions 45 and 46 can be formed as small as possible within the limit of photolithography technology. The width (diameter) of the second protrusions 45 and 46 can be made equal to or smaller than 5 μm or preferably equal to or smaller than 2 μm.

Therefore, with the embodiment illustrated in FIG. 11, in which the second protrusions 45 and 46 are formed on the leg portion 4b and the movable portion 2, the contact area between the leg portion 4b and the stopper surface 41a and the contact area between the movable portion 2 and the stopper surface 42a can be more effectively reduced.

In FIG. 11, the first protrusions 41 and 42 may or may not be provided on the facing portion 30. Although the second protrusion 45 is disposed at an inward part of the leg portion 4b in FIG. 11, the second protrusion 45 may be disposed at the distal end of the leg portion 4b.

Figure 11A:
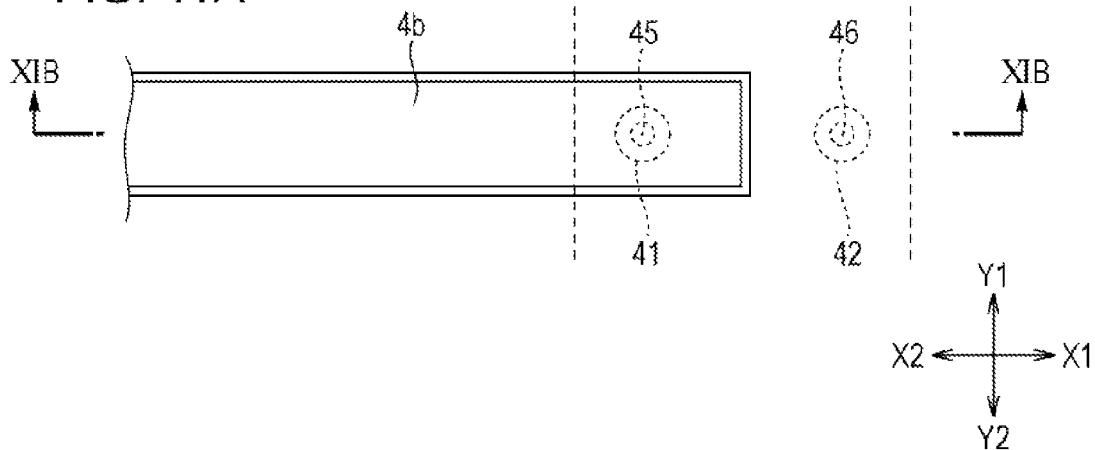
FIGS. 11A to 11C illustrate a more preferable stopper structure, FIG. 11A being an enlarged partial plan view, FIG. 11B being a partial sectional view taken along line XIB-XIB of FIG. 11A and illustrating a state in which a leg portion is in contact with a stopper surface, FIG. 11C being a partial sectional view illustrating a state in which a movable portion is in contact with a stopper surface.
Figure 11B:
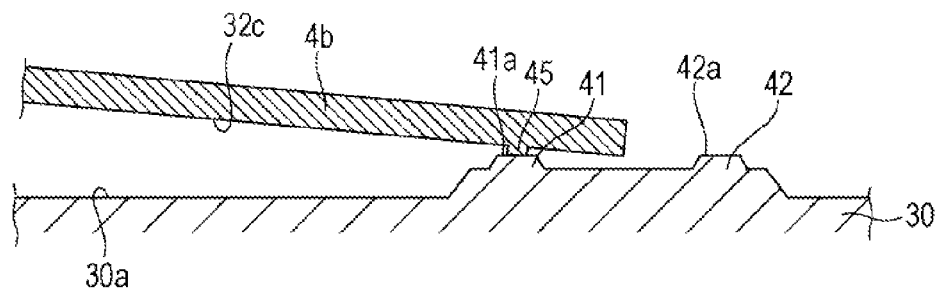
Figure 11C:
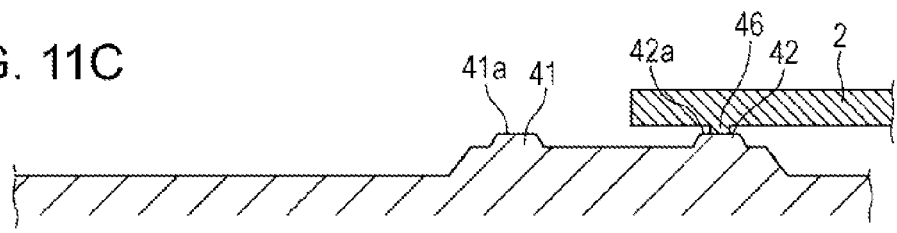
Figure 12:
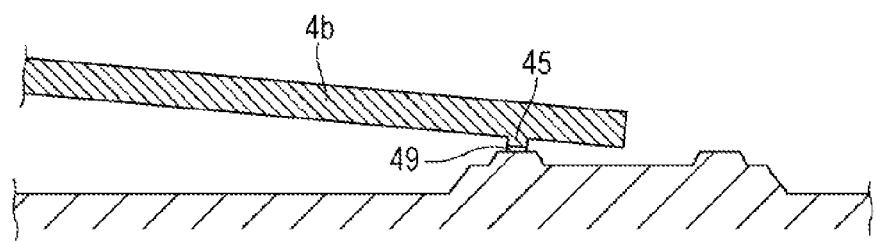
FIG. 12 is a partial sectional view illustrating a modification of the stopper structure of FIG. 11.

FIG. 12 illustrates an embodiment in which a metal layer 49 is disposed on the surface of the second protrusion 45. The second protrusion 45 illustrated in FIGS. 11A to 12 is formed by etching a silicon substrate. The embodiment illustrated in FIG. 12 further includes the metal layer 49 on the surface of the second protrusion 45. The metal layer 49 is the same as a part of a metal layer that is formed when joining the anchor portions 5 to 7 (see FIG. 1 and other figures) to the facing portion 30 through the metal layer. That is, the metal layer 49 is formed beforehand not only on the anchor portions 5 to 7 but also on a part of the leg portion 4b to become the second protrusion 45; and then, for example, by etching the silicon substrate by using the metal layer 49 as a mask, the leg portion 4b having the second protrusion 45 made of silicon and the metal layer 49 formed on the surface of the second protrusion 45 can be formed as illustrated in FIG. 12.

Figure 14:
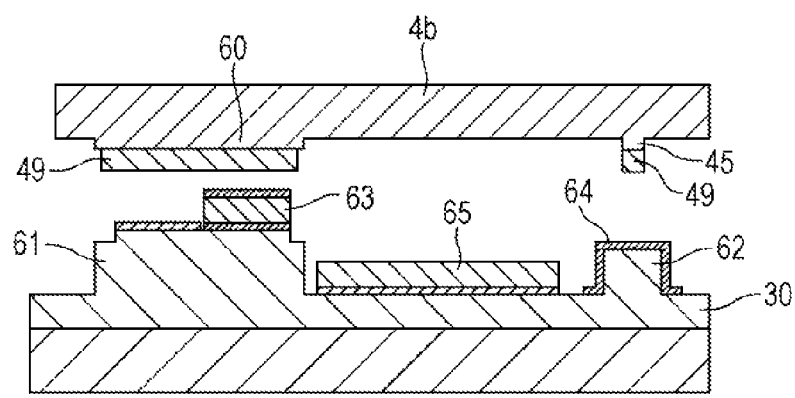
FIG. 14 is a partial sectional view schematically illustrating a production process of the embodiment illustrated in FIG. 12.

FIG. 14 is a sectional view schematically illustrating a process of producing the embodiment illustrated in FIG. 12. As illustrated in FIG. 14, a base 61 is formed on the facing portion 30 at a position facing an anchor portion 60. A base 62 is disposed at a position facing the second protrusion 45 formed on the leg portion 4b, and the height of the base 62 is smaller than the height of the base 61. A first metal layer 63 is disposed on the surface of the base 61. The second metal layer 49 is formed on the surface of each of the anchor portion 60 and the second protrusion 45. The second metal layer 49 on the anchor portion 60 and the first metal layer 63 on the facing portion 30 are bonded to each other by eutectic bonding or by diffusion bonding. For example, one of the metal layers 49 and 63 may be made of Al and the other may be made of Ge. The numeral 64 represents a Ti underlying layer and the numeral 65 represents a fixed electrode.

As illustrated in FIG. 14, the first metal layer 63 is not disposed on the facing portion 30 that faces the second protrusion 45. Moreover, there is a difference between the height of the base 61 that faces the anchor portion 60 and the height of the base 62 that faces the second protrusion 45. Therefore, when the anchor portion 60 and the facing portion 30 are fixed to each other by eutectic bonding as described above, a space (an allowance space in which the leg portion 4b can be displaced in the height direction) can be appropriately formed between the base 62 and the second protrusion 45.

Figure 15:
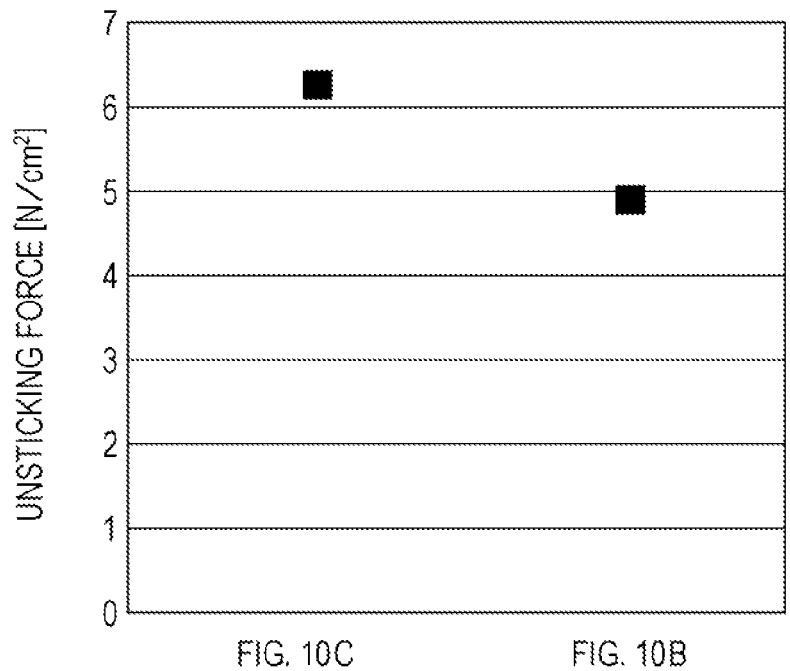
FIG. 15 is a graph illustrating a result of an experiment of measuring an unsticking force of the stopper structure illustrated in FIG. 10.

FIG. 15 is a graph illustrating a result of an experiment of measuring an unsticking force performed by using the physical quantity sensor illustrated in FIG. 10. The unsticking force can be obtained by dividing a restoring force, which is calculated on the basis of a spring constant, by a contact area. Therefore, if the contact area can be reduced, the unsticking force can be increased and the anti-sticking characteristics can be improved.

With the configuration of the comparative example illustrated in FIG. 13, the unsticking force when the leg portions 3b and 4b are in contact with the stopper surface 43a is equal to or smaller than 1 N/cm2. In the comparative example illustrated in FIG. 13, the (total) contact area between the leg portions 3b and 4b and the stopper surface 43a was about 2206 μm2 and the restoring force was 2.82×10-6 (N).

On the other hand, in each of the configurations illustrated in FIGS. 10B and 10C, the contact area could be reduced to about 40 μm2. The contact area was calculated assuming that both of the leg portions 3b and 4b contact the stopper surface 41a and the movable portion 2 contacts the stopper surfaces 42a of the two first protrusions 42. The unsticking force was measured by using the contact area and the restoring force (1.96×10-6 (N) for FIG. 10B and 2.50×10-6 (N) for FIG. 10C). The experiment was performed assuming that FIGS. 10, 11, and 13 differ from each other only in the stopper mechanism and that the other parts are the same.

As illustrated in FIG. 15, with the configuration illustrated in FIG. 10, the unsticking force could be effectively increased as compared with the configuration illustrated in FIG. 13, with which the unsticking force was equal to or smaller than 1 N/cm2.

Figure 16:
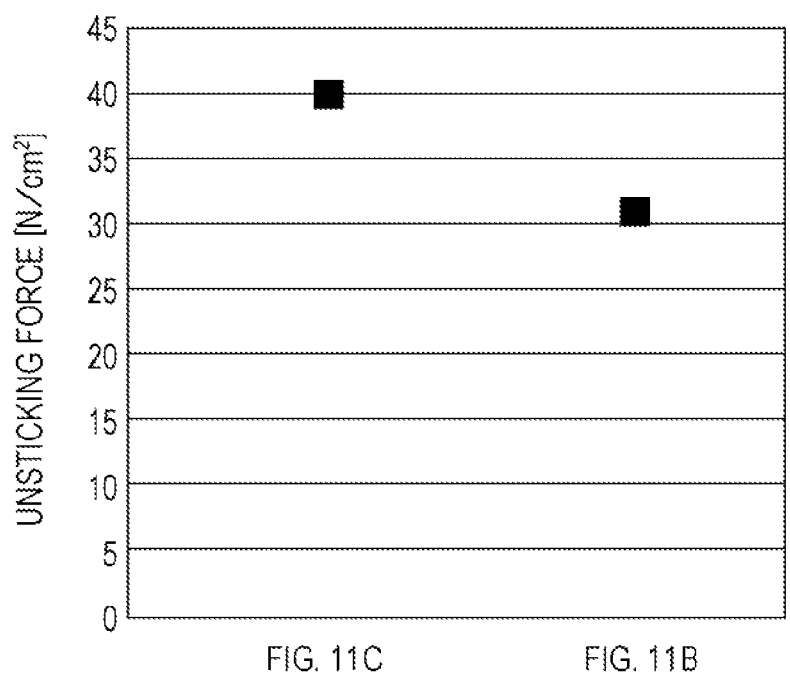
FIG. 16 is a graph illustrating a result of an experiment of measuring an unsticking force of the stopper structure illustrated in FIG. 11.

FIG. 16 is a graph illustrating a result of an experiment of measuring an unsticking force performed by using the physical quantity sensor illustrated in FIG. 11.

With each of the configurations illustrated in FIGS. 11B and 11C, the contact area could be reduced to about 6.3 μm2. The contact area was calculated assuming that second protrusions 45 formed on both of the leg portions 3b and 4b contact the stopper surface 41a and the two second protrusions 46 formed on the movable portion 2 contact the stopper surfaces 42a of the first protrusions 42. The unsticking force was measured by using the contact area and the restoring force (1.96×10-6 (N) for FIG. 11B and 2.50×10-6 (N) for FIG. 11C).

Figure 13A:
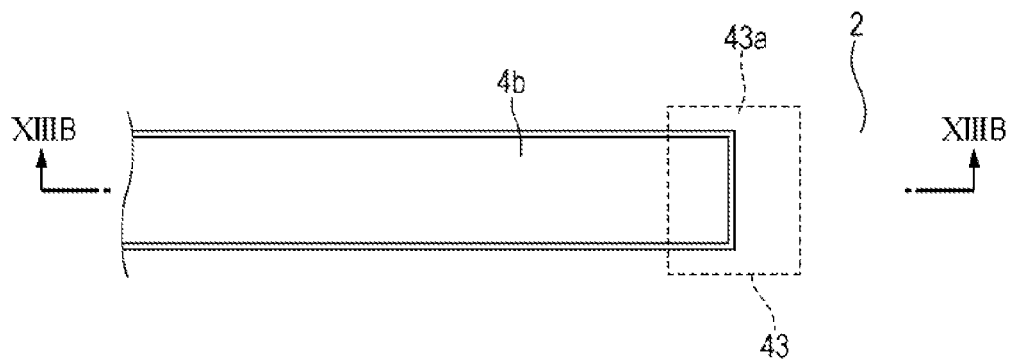
FIGS. 13A and 13B illustrate a stopper structure corresponding to a comparative example that is compared with the structure of FIGS. 10A to 10C and that is used in an experiment of FIG. 15, FIG. 13A being an enlarged partial plan view, FIG. 13B being a partial sectional view taken along line XIIIB-XIIIB of FIG. 13A and illustrating a state in which a leg portion is in contact with a stopper surface.
Figure 13B:
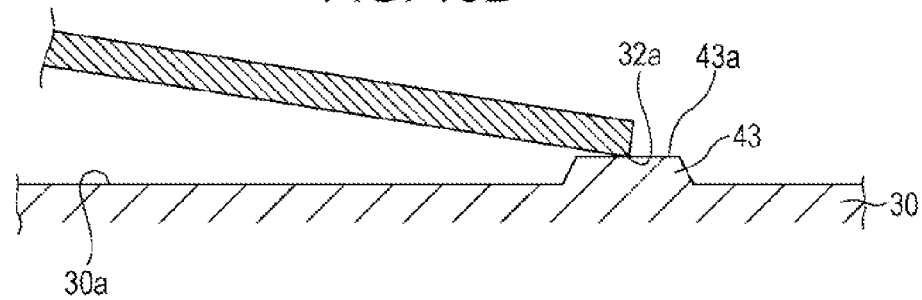

As illustrated in FIG. 16, the unsticking force of the configuration illustrated in FIG. 11 could be made considerably larger than that of the configuration illustrated in FIGS. 13A and 13B and sufficiently larger than that of the configuration illustrated in FIG. 10.

Figure 17A:
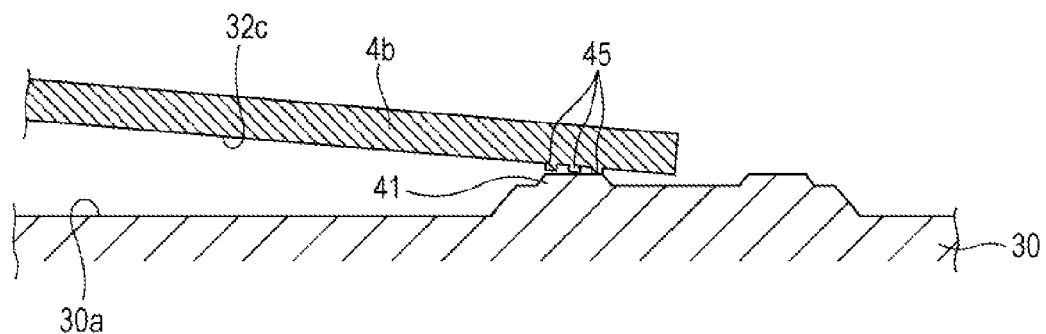
FIG. 17A illustrates an embodiment that is different from that of FIG. 11B in a state in which a leg portion is in contact with a stopper surface.
Figure 17B:
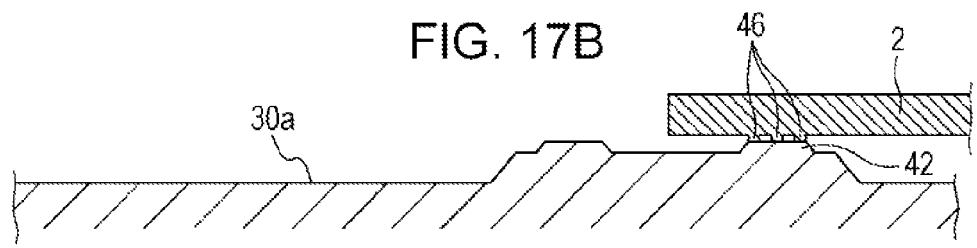
FIG. 17B illustrates an embodiment that is different from that of FIG. 11C in a state in which a movable portion is in contact with a stopper surface.

FIGS. 17A and 17B differ from FIGS. 11B and 11C in that a plurality of the second protrusions 45 and 46 are densely arranged. In FIG. 17A, a plurality of the second protrusions 45 are densely arranged on the lower surface 32c of the leg portion 4b. The other leg portion 3b, which is not illustrated in FIG. 17A, has a similar structure. In FIG. 17A, the second protrusions 45 are arranged in the direction in which the leg portion 4b extends. Moreover, the second protrusions 45 are arranged in the width direction of the leg portion 4b (in the depth direction of the figure). The same applies to FIG. 17B. The second protrusions 45 are formed at positions facing the first protrusion 41 formed on the surface 30a of the facing portion 30.

In the structure illustrated in FIG. 17B, a plurality of the second protrusions 46 are densely arranged on the movable portion 2. The second protrusions 46 are formed at positions facing the first protrusion 42 formed on the surface 30a of the facing portion 30.

Each of the second protrusions 45 and 46 has, for example, a dot-like shape as illustrated in FIG. 11A. However, the shape of the second protrusions 45 and 46 is not particularly limited.

By densely forming a plurality of the second protrusions 45 and 46, the contact area between the leg portions 3b and 4b and the facing portion 30 and the contact area between the movable portion 2 and the facing portion 30 can be reduced as compared with the configuration illustrated in FIG. 13. Thus, the anti-sticking characteristics can be improved and the mechanical strength of the second protrusions 45 and 46 can be increased. That is, if the number of each of the second protrusions 45 and 46 is, for example, one, the second protrusions 45 and 46 may be easily broken due to impact or the like. Moreover, the anti-sticking characteristics tend to deteriorate because there is no substitute if the only one second protrusion is broken. In contrast, when a plurality of the second protrusions 45 and 46 are densely arranged, a force is uniformly applied to the second protrusions 45 and 46, so that a stopper structure that is resistant to abrasion and breakage is realized and good anti-sticking characteristics can be maintained because a substitute protrusion is present even if some of the protrusions suffer from breakage or the like.

Only the second protrusions 45 and 46 have been described with reference to FIG. 17. However, a plurality of the first protrusions 41 and 42 may be densely arranged on the surface 30*a* of the facing portion 30. Both a plurality of the first protrusions 41 and 42 and a plurality of the second protrusions 45 and 46 may be densely arranged.

Figure 18:
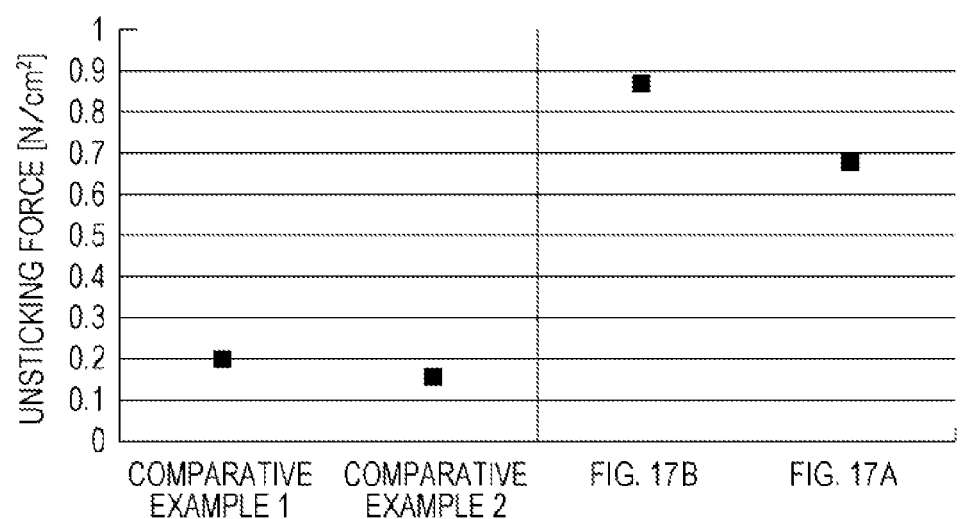
FIG. 18 is a graph illustrating a result of measuring an unsticking force of the stopper structure illustrated in FIG. 17.

FIG. 18 is a graph illustrating a result of an experiment of measuring an unsticking force performed by using the physical quantity sensor illustrated in FIG. 17. Comparative example 1 and comparative example 2 relate to configurations that do not include the first protrusion and the second protrusion as illustrated in FIG. 13. Comparative example 1 is a result of an experiment of measuring an unsticking force when the movable portion 2 contacted the surface 43*a* (stopper surface) of the base 43 formed on the surface 30*a* of the facing portion 30. Comparative example 2 is a result of an experiment of measuring an unsticking force when the leg portion contacted the surface 43*a* (stopper surface) of the base 43 formed on the surface 30*a* of the facing portion 30. The unsticking force in comparative example 1 was calculated on the basis of a restoring force of $2.50 \times 10^{-6}$ (N) and a contact area of 1250 ($\mu m^2$) The unsticking force in comparative example 2 was calculated on the basis of a restoring force of $1.96 \times 10^{-6}$ (N) and a contact area of 1250 ($\mu m^2$).

The unsticking force of the embodiment illustrated in FIG. 17A was calculated on the basis of a restoring force of $1.96 \times 10^{-6}$ (N) and a contact area of 288 ($\mu^2$). The unsticking force of the embodiment illustrated in FIG. 17B was calculated on the basis of a restoring force of $2.50 \times 10^{-6}$ (N) and a contact area of 288 ($\mu m^2$).

As illustrated in FIG. 18, in the configurations in which a plurality of protrusions that serve as stoppers are densely arranged as illustrated in FIG. 17A, the unsticking force was larger than that of the configuration in which the protrusions are not formed.

Figure 19:
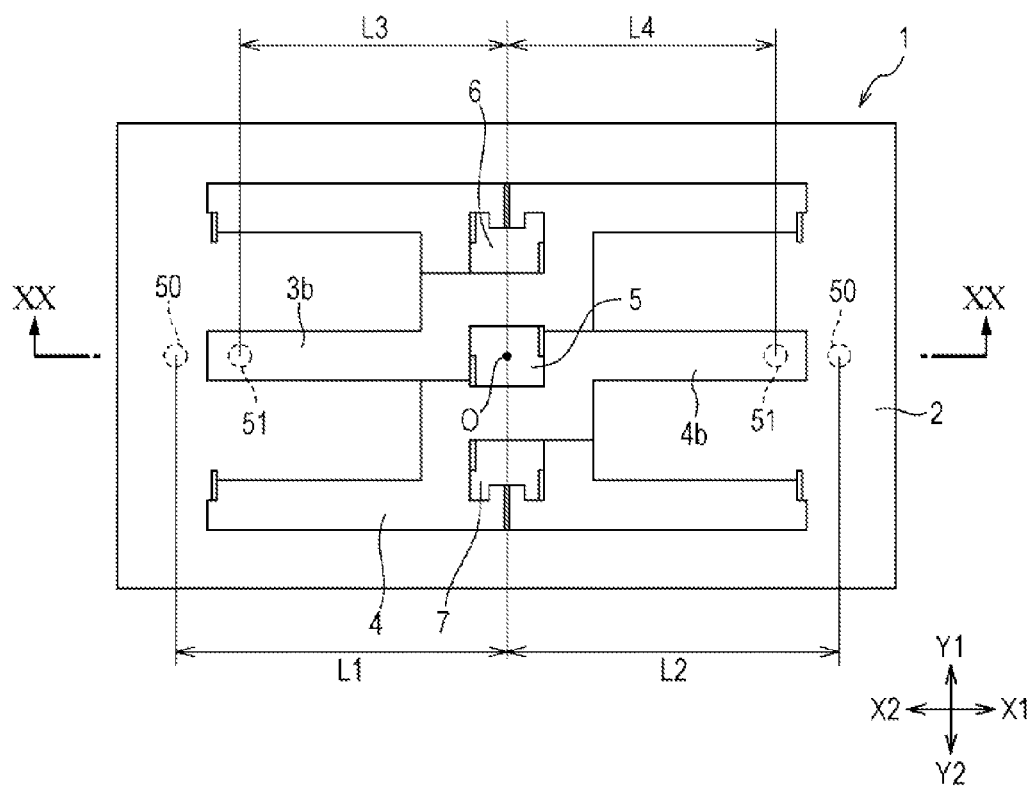
FIG. 19 is a plan view of a physical quantity sensor according to the present embodiment having a preferable stopper structure.
Figure 20:
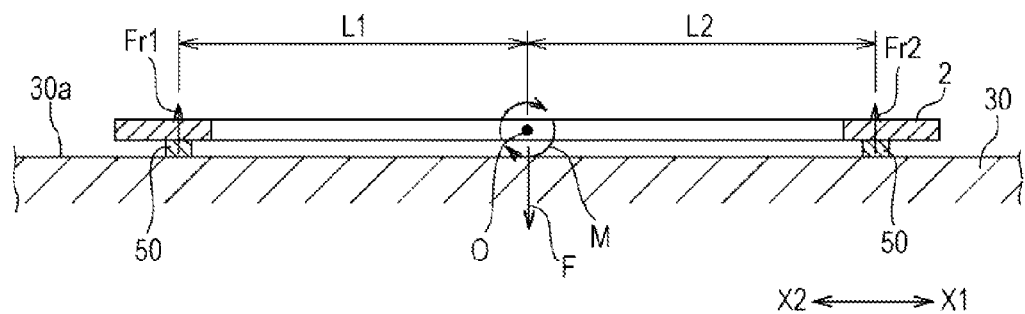
FIG. 20 is a partial sectional view of a physical quantity sensor taken along a line XX-XX of FIG. 19 in a height direction and seen from the direction of arrows (from which an anchor portion, a leg portion, and a protrusion facing the leg portion are omitted).

FIG. 19 is a plan view of a physical quantity sensor according to another example of the present embodiment, and FIG. 20 is a partial sectional view of the physical quantity sensor illustrated in FIG. 19 taken along the X1-X2 direction and in the height direction. The middle anchor portion 5, the leg portions 3*b* and 4*b*, and protrusions that face the leg portions 3*b* and 4*b*, which are illustrated in FIG. 19, are not illustrated in FIG. 20. FIG. 20 illustrates the movable portion 2 assuming that these portions are transparent.

In plan view, the movable portion 2 and the supporting portions 3 and 4 illustrated in FIG. 19 are not different from those illustrated in FIG. 1. As illustrated in FIGS. 19 and 20, a pair of protrusions 50, which serve as stoppers, are formed on the surface 30*a* of the facing portion 30, which faces the movable portion 2 in the height direction. The protrusions 50 are respectively disposed at positions that are separated from the center of gravity O of the movable portion 2 in the forward (X1) and backward (X2) directions by distances L1 and L2, and the distances L1 and L2 are the same.

As illustrated in FIG. 20, the movable portion 2 contacts the protrusions 50 due to an inertial force F. At this time, when a rotation moment M balances, the movable portion 2 stops moving. The condition for balancing the rotation moment is $$F = Fr1 + Fr2$$

Fr1·L1=Fr2·L2, where Fr1 and Fr2 are reaction forces.

It can be seen from these equations that Fr1=Fr2 if the distances L1 and L2 satisfy L1=L2.

Therefore, when the protrusions 50 are disposed on both sides of the center of gravity O of the movable portion 2 at equal distances as illustrated in FIGS. 19 and 20, the reaction forces are uniformly applied to the protrusions 50, and thereby breakage or the like of the protrusions 50 can be appropriately prevented.

Likewise, as illustrated in FIG. 19, when protrusions 51, which serve as stoppers for the leg portions 3*b* and 4*b*, are respectively disposed at distances L3 and L4 from the center of gravity O of the movable portion 2 in the forward (X1) and backward (X2) directions and the distances L3 and L4 are equal, the reaction forces are uniformly applied to the protrusions 51, and thereby breakage or the like of the protrusions 51 can be appropriately prevented.

If the acceleration is small, the leg portions 3*b* and 4*b* do not contact the stopper surface. The leg portions 3*b* and 4*b* serve to prevent the movable portion 2 from being displaced by more than a predetermined amount, and the leg portions 3*b* and 4*b* do not necessarily contact the stopper surface when a physical quantity is generated.

With the present embodiment, a physical quantity can be detected by detecting a change in the capacitance between the movable portion 2 and the fixed electrode disposed on the facing portion 30. The configuration of the detection portion is not limited to a capacitance type. However, a simple and high-precision detection portion can be realized with a capacitance-type detection configuration.

The present embodiment is applicable not only to an acceleration sensor but also to physical quantity sensors in general, such as an angular velocity sensor and a shock sensor.

What is claimed is:

1. A physical quantity sensor comprising:
   an anchor portion immovably supported;
   a movable portion displaceable in a height direction;
   a plurality of supporting portions each rotatably coupled to the anchor portion and to the movable portion; and
   a detection portion configured to detect displacement of the movable portion,
   wherein each supporting portion includes:
      a first connection arm extending from the anchor portion and connecting to the movable portion, configured to rotate in a first direction around a fulcrum joint provided between the anchor portion and the first connection arm;
      a leg portion extending from the anchor portion in a direction opposite to the first connection arm, configured to rotate around the fulcrum joint in a second direction opposite to the first direction, the leg portion restricting the displacement of the movable portion by moving in a direction opposite to a displacement direction of the movable portion when the supporting portion rotates and the movable portion is displaced in the height direction, and
   wherein the first connection arm of one of the supporting portions and the first connection arm of another of the supporting portions extend in opposite directions with respect to the anchor portion therebetween, and the leg portion of the one of the supporting portions and the leg portion of the another of the supporting portions extend in opposite directions with respect to the anchor portion therebetween.

2. The physical quantity sensor according to claim 1, further comprising:
   a facing member to which the leg portion approaches when the leg portion is displaced in the direction opposite to the displacement direction of the movable portion; and
   a stopper surface provided on the facing member, configured to receive the leg portion.

3. The physical quantity sensor according to claim 1,
wherein a relationship: length a<length b is satisfied, where the length a is a length between the fulcrum joint and a distal end of the first connection arm, and the length b is a length between the fulcrum joint and a distal end of the leg portion, the length a and the length b being measured along the first connection arm and the leg portion, respectively.

4. The physical quantity sensor according to claim 1, further comprising:
a second connection arm extending from the anchor portion in a direction opposite to the first connection arm and connecting to the movable portion, the second connection arm being not part of the plurality of supporting portions.

5. The physical quantity sensor according to claim 4,
wherein a proximal end of the first connection arm and a proximal end of the second connection arm are connected to each other, while respective distal ends of the first connection arm and the second connection arm are connected to the movable portion.

6. The physical quantity sensor according to claim 4,
wherein the anchor portion, the supporting portion, and the second connection arm are formed inwardly from the movable portion,
wherein the anchor portion includes a left anchor portion and a right anchor portion arranged in a left-right (Y)-direction with a distance therebetween,
wherein the supporting portion includes:
  a first supporting portion connected to the left anchor portion, and including the first connection arm extending in a forward (X1)-direction from the left anchor portion and the leg portion extending in a backward (X2)-direction from the left anchor portion; and
  a second supporting portion connected to the right anchor portion, and including the first connection arm extending in the backward (X2)-direction from the right anchor portion and the leg portion extending in the forward (X1)-direction from the right anchor portion, and
wherein the second connection arm includes:
  a left second connection arm provided between the left anchor portion and the movable portion, and extending in a direction opposite to the first connection arm of the first supporting portion; and
  a right second connection arm provided between the right anchor portion and the movable portion, and extending in a direction opposite to the first connection arm of the second supporting portion.

7. The physical quantity sensor according to claim 6, further comprising: wherein
a middle anchor portion disposed between the left anchor portion and the right anchor portion,
wherein the first supporting portion is connected to both of the middle anchor portion and the left anchor portion, and the second supporting portion is connected to both of the middle anchor portion and the right anchor portion.

8. The physical quantity sensor according to claim 7,
wherein the middle anchor portion, the left anchor portion, and the right anchor portion are arranged on a same line extending in the left-right (Y)-direction, the physical quantity sensor further comprising:
a fixing portion immovably supporting the anchor portions.

9. The physical quantity sensor according to claim 1, further comprising:
a facing member to which the leg portion approaches when the leg portion is displaced in a direction opposite to the displacement direction of the movable portion,
wherein the detection portion is disposed on the facing member at a location facing the movable portion.

10. The physical quantity sensor according claim 1, further comprising:
a facing member to which the leg portion approaches when the leg portion is displaced in the direction opposite to the displacement direction of the movable portion; and
a first protrusion provided on the facing member,
wherein the first protrusion is smaller than a width of the leg portion, and includes a stopper surface facing the leg portion at a position more inside than an edge of a distal end of the leg portion.

11. The physical quantity sensor according to claim 10, further comprising:
another first protrusion provided on the facing member at a position facing the movable portion.

12. The physical quantity sensor according to claim 10,
wherein the first protrusion includes a plurality of protrusions formed in close proximity to each other.

13. The physical quantity sensor according to claim 1, further comprising:
a facing member to which the leg portion approaches when the leg portion is displaced in the direction opposite to the displacement direction of the movable portion; and
a second protrusion provided on a facing surface of the leg portion, the facing surface facing the facing member.

14. The physical quantity sensor according to claim 13, further comprising:
another second protrusion disposed on a facing surface of the movable portion, the facing surface of the movable portion facing the facing member.

15. The physical quantity sensor according to claim 13,
wherein the second protrusion includes a plurality of protrusions formed in close proximity to each other.

16. The physical quantity sensor according to claim 1, further comprising:
a facing member to which the movable portion faces in the height direction; and
protrusions provided on the facing member at locations corresponding to positions on the movable portion located on both sides of a center of gravity of thereof at an equal distance from the center of gravity, the protrusions functioning as stoppers for restricting the displacement of the movable portion when the movable portion is displaced toward the facing member.

17. The physical quantity sensor according to claim 1,
wherein the leg portions are formed so as to extend on both sides of a center of gravity of the movable portion, the physical quantity sensor further comprising:
a facing member facing the leg portions in the height direction; and
protrusions provided on the facing member at locations facing the leg portions, the locations corresponding to positions on the movable portion located on both sides of a center of gravity thereof at equal distances from the center of gravity, the protrusions functioning as stoppers for receiving the lee portions when the leg portions are displaced toward the facing member.

18. A physical quantity sensor comprising:
an anchor portion immovably supported;
a movable portion displaceable in a height direction;
a plurality of supporting portions each rotatably coupled to the anchor portion and the movable portion; and a detection portion configured to detect displacement of the movable portion, wherein each supporting portion includes:
- a first connection arm extending from the anchor portion and connecting to the movable portion; and
- a leg portion extending from the anchor portion in a direction opposite to the first connection arm, the leg portion configured to be displaced in a direction opposite to a displacement direction of the movable portion when the supporting portion rotates and the movable portion is displaced in the height direction, wherein the first connection arm of one of the supporting portions and the first connection arm of another of the supporting portions extend in opposite directions with respect to the anchor portion therebetween, and the leg portion of the one of the supporting portions and the leg portion of the another of the supporting portions extend in opposite directions with respect to the anchor portion therebetween, and wherein the physical quantity sensor further comprises:
- a facing member to which the leg portion approaches when the leg portion is displaced in the direction opposite to the displacement direction of the movable portion; and
- a stopper surface provided on the facing member, configured to receive the leg portion.

* * * * *